US008283679B2

(12) United States Patent
Yamazaki et al.

(10) Patent No.: US 8,283,679 B2
(45) Date of Patent: Oct. 9, 2012

(54) SEMICONDUCTOR DEVICE HAVING LIGHT-EMITTING ELEMENT AND LIGHT-RECEIVING ELEMENT FOR TRANSMITTING AMONG CIRCUITS FORMED OVER THE PLURALITY OF SUBSTRATES

(75) Inventors: Shunpei Yamazaki, Tokyo (JP); Ryoji Nomura, Kanagawa (JP); Hiroko Abe, Tokyo (JP); Mikio Yukawa, Kanagawa (JP); Yasuyuki Arai, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1105 days.

(21) Appl. No.: 10/878,654

(22) Filed: Jun. 29, 2004

(65) Prior Publication Data

US 2005/0006648 A1 Jan. 13, 2005

(30) Foreign Application Priority Data

Jun. 30, 2003 (JP) ................................. 2003-187601

(51) Int. Cl.
*H01L 27/14* (2006.01)
(52) U.S. Cl. .......................................... 257/84; 257/114
(58) Field of Classification Search .................... 257/72, 257/84, 113, 114
See application file for complete search history.

(56) References Cited

U.S. PATENT DOCUMENTS

| | | | | |
|---|---|---|---|---|
| 5,077,752 A | * | 12/1991 | Tada et al. ........................ | 372/96 |
| 5,164,955 A | * | 11/1992 | Meyers ............................ | 372/96 |
| 5,200,631 A | | 4/1993 | Austin et al. | |
| 5,271,030 A | * | 12/1993 | Chinen ............................ | 372/96 |
| 5,357,122 A | * | 10/1994 | Okubora et al. ................ | 257/84 |
| 5,478,658 A | | 12/1995 | Dodabalapur et al. | |
| 5,483,263 A | | 1/1996 | Bird et al. | |

(Continued)

FOREIGN PATENT DOCUMENTS

EP 0526776 2/1993

(Continued)

OTHER PUBLICATIONS

"Diffraction by a Periodic Structure," (http://www.wias-berlin.de/~schmidt/diffpage/index.html) by Dr. Gunter Schmidt, Weierstrass Institute, Berlin.*

(Continued)

*Primary Examiner* — Thomas L Dickey
(74) *Attorney, Agent, or Firm* — Eric J. Robinson; Robinson Intellectual Property Law Office, P.C.

(57) ABSTRACT

The present invention provides a semiconductor device having an integrated circuit formed by a low cost glass substrate, which can respond to the increase of an amount of information, and which offers high performance at high speed. A semiconductor device comprises a plurality of glass substrates respectively provided with a circuit including a semiconductor element, in which each of the plurality of glass substrates has both or either of a light-emitting element and/or a light-receiving element; wherein the light-emitting element is formed to have an electroluminescent layer interposed between a pair of electrodes, in which the electroluminescent layer is formed by stacking a plurality of layers capable of emitting light each other so that laser light is oscillated upon applying current to the electroluminescent layer; and a signal is transmitted among circuits formed over the plurality of glass substrates by generating a light signal using the laser light oscillated from the light-emitting element and converting the light signal into an electrical signal in the light-receiving element.

77 Claims, 17 Drawing Sheets

U.S. PATENT DOCUMENTS

| | | | |
|---|---|---|---|
| 5,488,735 A | 1/1996 | Tanabe et al. | |
| 5,502,837 A | 3/1996 | Hoffert | |
| 5,796,714 A * | 8/1998 | Chino et al. | 372/50.124 |
| 6,111,902 A | 8/2000 | Kozlov et al. | |
| 6,160,828 A | 12/2000 | Kozlov et al. | |
| 6,577,657 B1 | 6/2003 | Elschner et al. | |
| 6,704,335 B1 | 3/2004 | Koyama et al. | |
| 6,730,933 B1 | 5/2004 | Shimizu et al. | |
| 2001/0006503 A1* | 7/2001 | Braitberg et al. | 369/77.2 |
| 2002/0009274 A1 | 1/2002 | Gharavi | |
| 2002/0158263 A1 | 10/2002 | Tanaka et al. | |
| 2002/0159487 A1* | 10/2002 | Thornton et al. | 372/26 |
| 2003/0002826 A1* | 1/2003 | Cohen et al. | 385/94 |
| 2003/0122137 A1 | 7/2003 | Hashimoto | |
| 2003/0139520 A1 | 7/2003 | Toyama et al. | |
| 2003/0218174 A1 | 11/2003 | Verdonk et al. | |
| 2004/0007706 A1 | 1/2004 | Yamazaki et al. | |
| 2004/0012016 A1 | 1/2004 | Underwood et al. | |
| 2004/0042707 A1 | 3/2004 | Imai et al. | |
| 2004/0061126 A1 | 4/2004 | Imai et al. | |
| 2004/0195572 A1 | 10/2004 | Kato et al. | |

FOREIGN PATENT DOCUMENTS

| | | |
|---|---|---|
| EP | 0 633 542 | 1/1995 |
| EP | 0 683 623 | 11/1995 |
| EP | 1 154 676 | 11/2001 |
| EP | 1 281 690 | 2/2003 |
| JP | 05-037357 | 2/1993 |
| JP | 05-211283 | 8/1993 |
| JP | 05-343183 | 12/1993 |
| JP | 09-246509 | 9/1997 |
| JP | 11-032009 | 2/1999 |
| JP | 11-289125 A | 10/1999 |
| JP | 2000-058259 | 2/2000 |
| JP | 2000-058882 | 2/2000 |
| JP | 2000-182781 A | 6/2000 |
| JP | 2000-277794 | 10/2000 |
| JP | 2002-324676 | 11/2002 |
| JP | 2003-109767 | 4/2003 |
| JP | 2003-168567 | 6/2003 |
| KR | 95-04420 | 4/1995 |
| WO | WO 98/50989 | 11/1998 |
| WO | WO-00/36664 | 6/2000 |
| WO | WO 01/33487 | 5/2001 |
| WO | WO 01/39554 | 5/2001 |
| WO | WO 02/31882 | 4/2002 |
| WO | WO 02/071557 | 9/2002 |

OTHER PUBLICATIONS

"http://www.personal.psu.edu/mkm20/cca.html," by Marta K. Maurer, Ph.D., Pennsylvania State University.*

Rogers et al., *Organic Smart Pixels and Complementary Inverter Circuits Formed on Plastic Substrates by Casting and Rubber Stamping*, IEEE Electron Devices Letters, vol. 21, No. 3, Mar. 2000, pp. 100-103.

Wu et al., *P-19: Design of a Novel a-Si PIN/OLED Image Sensor & Display Device*, SID 99 Digest, Jan. 1, 1999, pp. 528-531.

Tessler, Nir, *Laser Based on Semiconducting Organic Materials*, Advanced Materials, vol. 11, No. 5, pp. 363-370, 1999.

* cited by examiner

SEMICONDUCTOR DEVICE HAVING LIGHT-EMITTING ELEMENT AND LIGHT-RECEIVING ELEMENT FOR TRANSMITTING AMONG CIRCUITS FORMED OVER THE PLURALITY OF SUBSTRATES

BACKGROUND OF THE INVENTION

1. Field of the Invention

This invention relates to a semiconductor device composed of a semiconductor film having a crystalline structure formed over a glass substrate, in which a signal is transmitted by light interconnection.

2. Related Art

A thin film transistor (TFT) formed over an insulating substrate or an insulating film has advantageous features that it can be manufactured easier than an MOS transistor, which is formed over a silicon wafer, and it can be manufactured at low cost by using a large substrate. Especially, since a TFT in which an active layer is formed by a polysilicon film (polycrystalline TFT) has larger mobility than that of a TFT including amorphous silicon, it is expected that the polycrystalline TFT is not only applied to a display device or photoelectric conversion but also widely applied to a functional device including a field of an integrated circuit.

However, an electrical characteristic of a polycrystalline TFT cannot be comparable to that of an MOS transistor formed over a so-called single crystalline silicon wafer (single crystalline transistor). Especially, on current and mobility of a polycrystalline TFT is inferior to those of a single crystalline transistor due to defects in a grain boundary. Therefore, in case of manufacturing an integrated circuit by using a polycrystalline TFT, the increase of the size of a TFT cannot be prevented when sufficient on current is attempted to obtain. Moreover, it is difficult to draw microscopic pattern at high speed on a large glass substrate. The foregoing factors have prevented the high integration of an integrated circuit.

If high integration is incomplete in an integrated circuit, the length of wirings connecting each device is increased, and wiring resistance is also increased. The increase of wiring resistance leads to the delay of signals and the distortion of a waveform. Consequently, an amount of the transmittance of signals is decreased. Therefore, the performance of information processing of the integrated circuit is limited, and the development of a high performance integrated circuit capable of operating at high speed is prevented. In addition, parasitic capacity between wirings is increased with increasing the length of wirings. Accordingly, charge and discharge energy for wirings is increased, which leads to the increase of power consumption.

Integrally forming various semiconductor circuits over one glass substrate becomes a factor of lowering yields. Further, since an integrated circuit is composed of circuits, each of which has various functions, it can predict that each circuit requires different kinds of performance from a TFT. In order to obtain desirable performance, the structure of a TFT of each circuit over one substrate is optimized. However, the process becomes complicated and the number of process is increased. Hence, yields are lowered and it becomes difficult to reduce the time required for completing a product (TAT: Turn Around Time).

Further, when semiconductor circuits formed over a plurality of substrates are connected with each other by an FPC or the like, the reliability of a mechanical strength is lowered since the connecting portion is weak against physical shocks. Further, in case of connecting by an FPC or the like, the number of connection terminals and the generation ratio of connection inferiors are increased with the increase of an amount of information of signals to be processed by a semiconductor device. Additionally, the increase of the number of connection terminals with the increase of an amount of information of signals to be processed by a semiconductor device may lead to the problem that all of the connection terminals cannot be arranged at an edge of a substrate. However, it is undesirable that the area of a substrate is enlarged only for spacing to arrange the connection terminals since it may prevent the miniaturization of a semiconductor device.

SUMMARY OF THE INVENTION

In view of the foregoing, it is an object of the present invention is to provide a semiconductor device having an integrated circuit formed by a low cost glass substrate, which can respond to the increase of an amount of information, and which offers high performance at high speed.

In order to solve the foregoing problems, various circuits composing an integrated circuit are formed over a plurality of glass substrates, in which transmittance of signals between each glass substrate is handled by using a light signal, so-called light interconnection. Specifically, a light-emitting element is formed at the output side of a circuit of an upper stage formed over a certain glass substrate, and a light-receiving element is formed at the input side of a circuit of a lower stage formed over another glass substrate so as to correspond to the light-emitting element. Then, a light signal converted from an electrical signal output from the circuit of the upper stage is output from the light-emitting element. And then, the light signal is converted into an electrical signal by the light-receiving element to input to the circuit of the lower stage.

By using light interconnection, data can be transmitted and received among glass substrates. If a glass substrate provided with a light-receiving element is stacked over the glass substrate, a signal from one light-emitting element can be received by a plurality of light-receiving elements. Therefore, a signal can be sent from one glass substrate to a plurality of other glass substrates simultaneously, and so an optical bus of very fast speed can be formed.

In the invention, an organic electroluminescent (EL) device capable of being formed with a TFT over a substrate is used as a light-emitting element. Light emitted from an organic electroluminescent device is preferably high directional laser light. However, light emitted from an organic electroluminescent device has generally a comparative wide wavelength band (poor color purity) and poor directional characteristics. Hence, the light cannot be used as laser light. Moreover, the conventional organic electroluminescent device cannot be applied with high density current that is required for laser oscillation.

In the invention, in order to emit laser light from an organic electroluminescent device used as a light-emitting element, a lamination structure and the thickness of each layer are determined in consideration of the wavelength of laser light. In the invention, a thin film formed mainly by organic compounds interposed between a pair of electrodes (an anode and a cathode) is referred to as an electroluminescent layer as a generic term. An electroluminescent layer is formed so as to be interposed between a pair of electrodes by a plurality of layers, each of which has different carrier transportation properties and emission wavelengths. Laser oscillation can be induced by applying current through the electroluminescent layer interposed between a pair of electrodes of an organic electroluminescent device used in the invention. This arises from the fact that a plurality of layers capable of emitting light is stacked each other as the electroluminescent layer.

The organic electroluminescent device is preferably formed to have a so-called resonator structure, in which a reflector is provided to either or both of surfaces of the electroluminescent layer inside the pair of electrodes. That is, a reflector is preferably provided to either or both of surfaces of the electroluminescent layer inside the pair of electrodes so that a stationary wave is produced with respect to light at specified wavelength emitted from the electroluminescent layer. Moreover, the electroluminescent layer is preferably formed to have a thickness of ½ time as a wavelength of laser oscillation (half wavelength) or integral multiple of the same.

An organic electroluminescent device used in the invention has a plurality of emission peaks. In the organic electroluminescent device, an electroluminescent layer emitting light having at least one emission peak with a half-band width of at most 10 nm is interposed between a pair of electrodes.

Further, the organic electroluminescent device is preferably formed to have a so-called resonator structure, in which a reflector is provided to either or both of surfaces of the electroluminescent layer inside the pair of electrodes. That is, a reflector is preferably provided to either or both of surfaces of the electroluminescent layer inside the pair of electrodes so that a stationary wave is produced with respect to light having an emission peak with a half-band width of at most 10 nm. Moreover, the electroluminescent layer is preferably formed to have a thickness of ½ time of a wavelength of laser oscillation, that is, half wavelength, or integral multiple of the same.

According to the invention, an organic electroluminescent device is formed to include a hole transporting layer that is formed on a light-emitting layer so as to emit light having an emission peak with a half-band width of at most 10 nm at a peak wavelength at a shorter wavelength side than the wavelength band of the light that is emitted from the light-emitting layer upon applying current. The light-emitting layer can contain metal complexes, organic dye materials, various derivatives, or the like in order to vary emission color.

An electroluminescent layer used in the invention has the configuration composed of a hole injecting layer, a hole transporting layer, a light-emitting layer, an electron transporting layer, an electron injecting layer, and the like. A material having hole transportation properties such as hole mobility is referred to as a hole injecting layer or a hole transporting layer. A material having electron transportation properties such as electron mobility is referred to as an electron injecting layer or an electron transporting layer. Though the hole transporting layer and the hole injecting layer are described respectively, they are the same in terms that they have the common property of hole transportation as most important property. As a matter of convenience, a layer adjacent to an anode is referred to as a hole injecting layer, and a layer adjacent to a light-emitting layer is referred to as a hole transporting layer. Further, a layer adjacent to a cathode is referred to as an electron injecting layer, a layer adjacent to a light-emitting layer is referred to as an electron transporting layer. The light-emitting layer may serve as the electron transporting layer, and so it can be referred to as a light-emitting electron transporting layer. In addition, the light-emitting layer may serve as a hole injecting layer, a hole transporting layer, an electron injecting layer, an electron transporting layer, and the like.

In a lamination configuration of such an electroluminescent layer, electrons injected from a cathode and holes injected from an anode are recombined to form an exciton in a light-emitting layer, and the exciton radiates light while they are back to the ground state. Light emission is obtained by so-called electroluminescence. In an organic electroluminescent device according to the invention, a hole transporting layer is formed on a light-emitting layer so as to emit light having an emission peak with a half-band width of at most 10 nm at a peak wavelength at a shorter wavelength side than the wavelength band of the light that is emitted from the light-emitting layer upon applying current. According to the above-mentioned structure, the electroluminescent device can oscillate laser light.

In an organic electroluminescent device according to the invention, an electroluminescent layer that emits light having an emission peak with a half-band width of at most 10 nm upon applying current is interposed between a pair of electrodes. The variation of emission peak intensity depending on a current density can be sorted by two linear regions with different gradients. A region of a sharp gradient is at a high current density side compared to a region of a slow gradient. Especially, one feature of the invention is that a threshold of two linear regions with different gradients is presented at a current density of from 5 m A/cm$^2$ to 20 mA/cm$^2$. Another feature of the invention is that the half-band width of an emission peak is varied to at least 20% until a current density for injecting an electroluminescent layer is reached to a threshold.

According to the above mentioned components, an organic electroluminescent device capable of oscillating laser light by current excitation can be provided. Therefore, cross talk occurred from light entering a light-receiving element that does not correspond to a light-emitting element among substrates can be prevented. Accordingly, light signals can be certainly sent and received.

Contrary to a single crystalline silicon wafer, a glass substrate transmits light, and so signals can be transmitted among three or more of substrates with comparative ease. In addition, as mentioned above, a TFT formed over a glass substrate is operated at lower speed than a single crystalline transistor. However, the bus width for transmitting signals between glass substrates can be formed largely, and so circuits over a plurality of substrates can efficiently operate in parallel by utilizing light signals for transmitting signals between the substrates. Consequently, the low operation speed of a TFT formed over a glass substrate than a single crystalline transistor can be covered.

In case that circuits formed over a glass substrate can not be formed integrally compared with a single crystalline silicon wafer, a plurality of glass substrates can be stacked by using light signals for transmitting signals between substrates. Accordingly, a device can be prevented from being bulky transversely. Moreover, wirings can be prevented from extending so that the increase of power consumption due to large wiring capacity can be prevented.

The structure of a TFT of each circuit can be optimized with ease by applying different processes to respective substrate. Accordingly, the increase of the number of process per one substrate and the increase of the time required for completing a product (TAT: Turn Around Time) can be prevented. Further, the cost can be reduced by using a low cost glass substrate, and a simple manufacturing method can be applied.

One integrated circuit is formed by combining circuits formed over each substrate. Accordingly, yields can be improved compared with the case that an integrated circuit is formed over one substrate. By using light signals for transmitting signals between substrates, the increase of the number of terminals such as an FPC for connecting electrically circuits with each other can be prevented, and the reliability of mechanical strength can be improved. Moreover, even if an amount of information of signals to be processed is increased, the deterioration of yields due to connection inferiors at terminals can be prevented.

Since contrary to the terminal of an FPC a light-emitting element and a light-receiving element are not always required to arrange at the edge of a substrate, the limitation of the layout of these devices can be reduced and these devices can response easily to the further increase of information to be processed.

By practicing the invention, a semiconductor device having a high performance integrated circuit capable of operating at high speed can be provided.

By using a substrate capable of transmitting light, signals can be transmitted among three or more of substrates with comparative ease. The bus width for transmitting signals between substrates can be formed largely, and so circuits over a plurality of substrates can efficiently operate in parallel. Consequently, the low operation speed of a TFT formed over a glass substrate than a single crystalline transistor can be covered.

In case that circuits formed over a glass substrate can not be formed integrally compared with a single crystalline silicon wafer, a plurality of glass substrates can be stacked by using light signals for transmitting signals between substrates. Accordingly, a device can be prevented from being bulky transversely. Moreover, wirings can be prevented from extending so that the increase of power consumption due to large wiring capacity can be prevented.

Further, an organic electroluminescent device capable of oscillating laser light by current excitation can be provided. Therefore, cross talk occurred from light entering a light-receiving element that does not correspond to a light-emitting element among substrates can be prevented. Accordingly, light signals can be certainly sent and received.

The structure of a TFT of each circuit can be optimized with ease by applying different processes to respective substrate. Accordingly, the increase of the number of process per one substrate and the increase of the time required for completing a product can be prevented. Further, the cost can be reduced by using a low cost glass substrate, and a simple manufacturing method can be applied.

One integrated circuit is formed by combining circuits formed over each substrate. Accordingly, yields can be improved compared with the case that an integrated circuit is formed over one substrate. By using light signals for transmitting signals between substrates, the increase of the number of terminals such as an FPC for connecting electrically circuits with each other can be prevented, and the reliability of mechanical strength can be improved. Moreover, even if an amount of information of signals to be processed is increased, the deterioration of yields due to connection inferiors at terminals can be prevented.

Since contrary to the terminal of an FPC a light-emitting element and a light-receiving element are not always required to arrange at the edge of a substrate, the limitation of the layout of these devices can be reduced and these devices can response easily to the further increase of information to be processed.

By practicing the invention, a semiconductor device having a high performance integrated circuit capable of operating at high speed can be provided.

These and other objects, features and advantages of the present invention will become more apparent upon reading of the following detailed description along with the accompanied drawings.

DESCRIPTION OF THE INVENTION

EMBODIMENT 1

Hereinafter, the structure of a semiconductor device according to the present invention will be explained in detail.

Figure 1A:
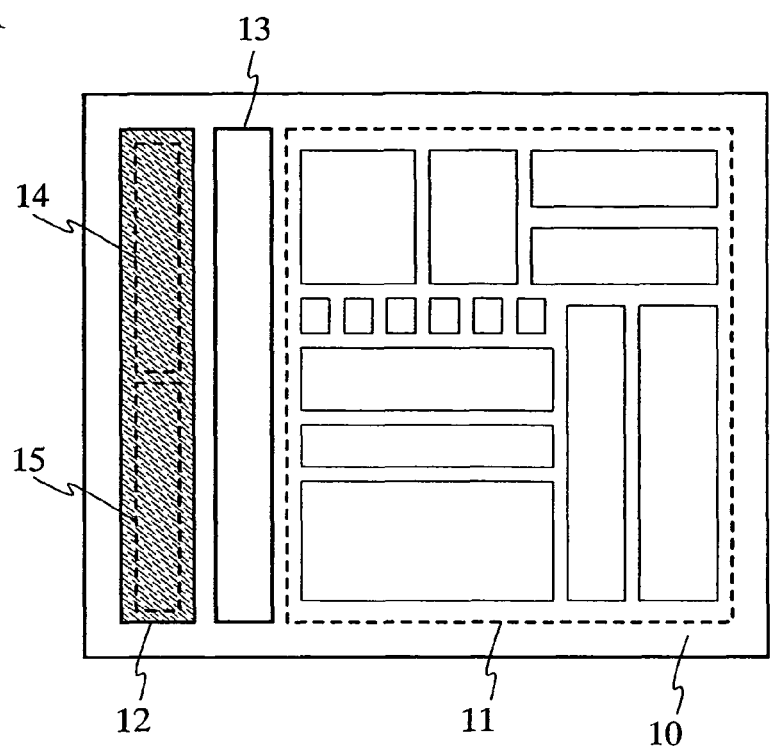
FIGS. 1A and 1B are views for showing the structure of a glass substrate having a light input/output unit.

FIG. 1A shows the illustrative structure of a glass substrate included in a semiconductor device according to the invention. In FIG. 1A, one or a plurality of circuits 11, which is formed by a semiconductor element, are provided over a glass substrate 10. Moreover, a light input/output unit 12 for sending and receiving light signals and an interface 13 for processing electric signals in and out of the light input/output unit 12 are provided over the glass substrate 10.

The light input/output unit 12 has a light input unit 14 provided with a light-receiving element for receiving light signals and a light output unit 15 provided with a light-emitting element for sending light signals. FIG. 1A illustrates the light input/output unit 12 divided into the light input unit 14 and the light output unit 15. However, the device for receiving light signals and the device for sending light signals may be mixed.

FIG. 1A shows the case that sending and receiving signals to/from another substrate is handled by only light signals. However, a part of signals can be sent and received as an electrical signal, in this case, a function for sending and receiving an electrical signal such as a terminal may be provided.

Figure 1B:
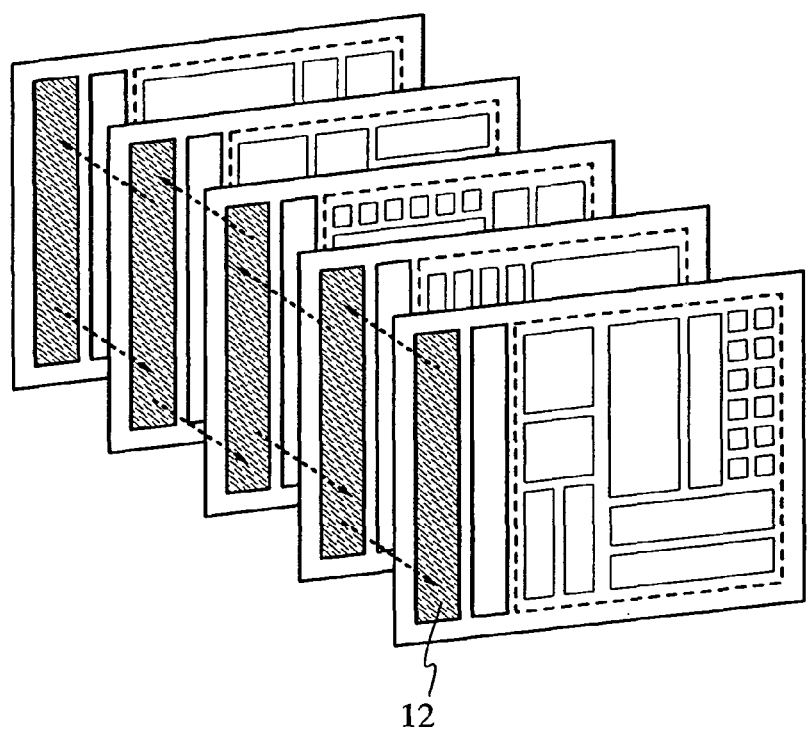

FIG. 1B shows the state in which a plurality of glass substrates illustrated in FIG. 1A are overlapped with each other for sending and receiving light signals among the glass substrates. Each the light input/output unit 12 of each the glass substrates is overlapped. By sending and receiving light signals among the glass substrates, an integrated circuit composed of the circuit 11 formed over each the glass substrate 10 is constructed.

Figure 2A:
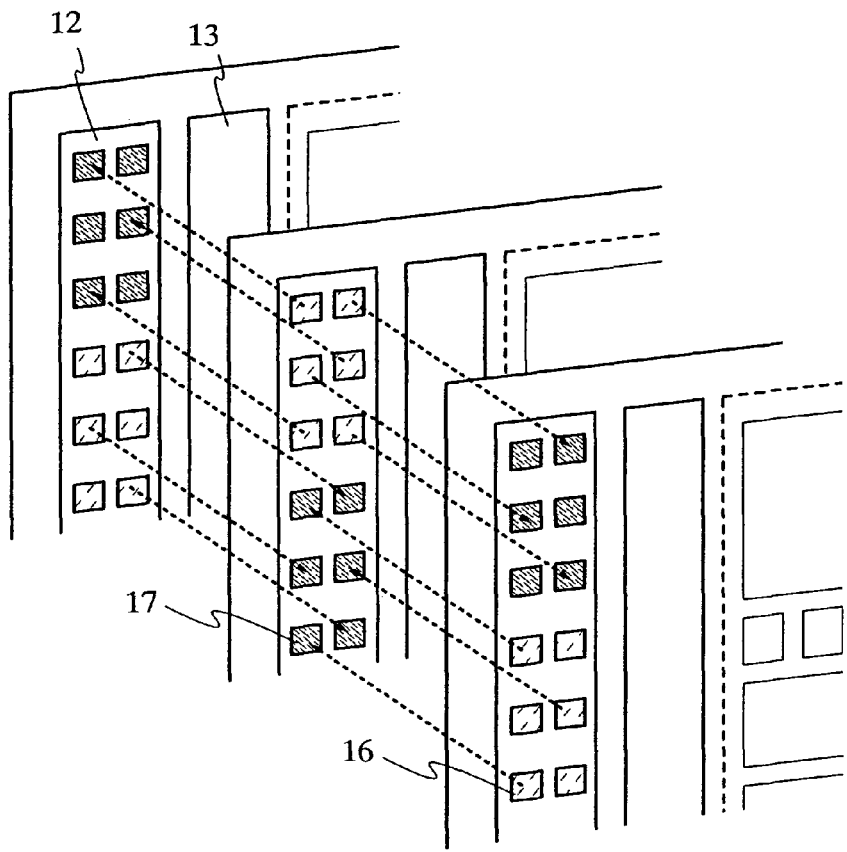
FIGS. 2A and 2B are views for showing a light input/output unit.

FIG. 2A is a further specific view for showing the structure of the light input/output unit 12. In FIG. 2A, one light-emitting element 16 of a substrate corresponds to at least one light-receiving element 17 of another substrate. The light-emitting element 16 is preferably formed over a glass substrate to produce directional light emission.

In FIG. 2A, only the light-emitting element 16 and the light-receiving element 17 are illustrated in the light input/output unit 12; however, a drive unit for producing light emission from the light-emitting element 16 by an electrical signal, a circuit for amplifying an electrical signal received from the light-receiving element 17, and a circuit for shaping the waveform of the received electrical signal are provided in the light input/output unit 12, practically. The interface 13 may have these functions.

Figure 2B:
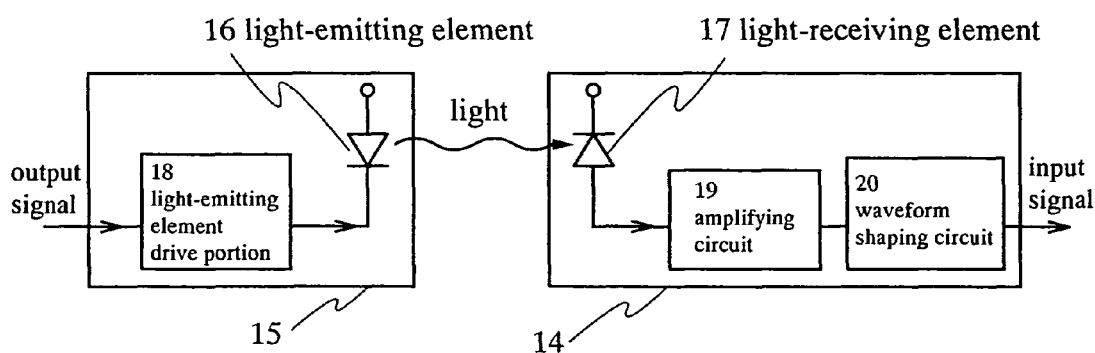

FIG. 2B is a view for showing specific structures of the light input unit 14 and the light output unit 15. The light output unit 15 has the light-emitting element 16 and a light-emitting element driving unit 18 for producing light emission from the light-emitting element 16 by using an electrical signal (output signal) outputted from the interface 13. The specific structure of the light-emitting element driving unit 18 can be appropriately decided in accordance with the structure of the light-emitting element 16.

The light input unit 14 has the light-receiving element 17, an amplifying circuit 19 for amplifying an electrical signal obtained in the light-receiving element 17, and a waveform shaping circuit 20 for shaping the waveform of an electrical signal. In addition, the amplifying circuit 19 and the waveform shaping circuit 20 are not always necessarily provided. Other than these circuits, a circuit for doing some sort of processing for the waveform of an electrical signal may be provided. In FIG. 2B, an electrical signal outputted from the waveform shaping circuit 20 is inputted to the interface 13.

In FIG. 2A, an example in which one light-emitting element 16 corresponds to one light-receiving element 17 is illustrated. However, the invention is not limited to the example. Two or more of the light-emitting element 16 can correspond to one light-receiving element 17, or one light-emitting element 16 can correspond to two or more of the light-receiving element 17.

Figure 3A:
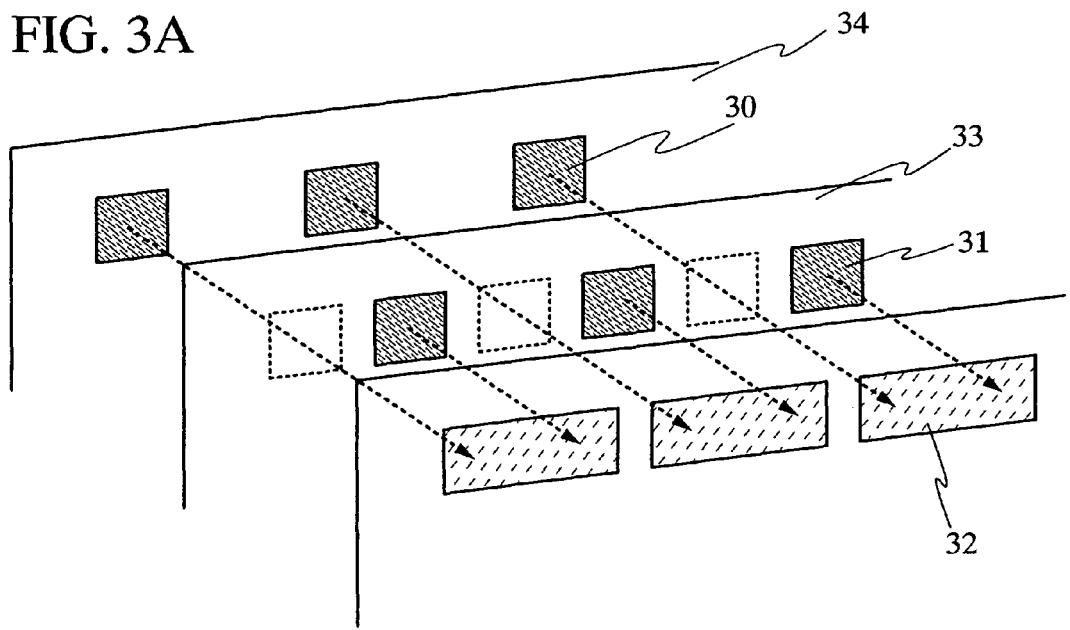
FIGS. 3A and 3B are views for showing a correspondence of a light-emitting element to a light-receiving element.

FIG. 3A shows the state in which two light-emitting elements, each of which is formed over different substrates, correspond to one light-receiving element formed over another substrate. A light-emitting element 30 is arranged so that light enters a light-receiving element 32 through a glass substrate 33 provided with a light-emitting element 31. Accordingly, while light signals are sent from the light-emitting element 30 to the light-receiving element 32, other operation can be performed at the glass substrate 33 provided with the light-emitting element 31. On the contrary, while light signals are sent from the light-emitting element 31 to the light-receiving element 32, other operation can be performed at a substrate 34 provided with the light-emitting element 30.

In case that two light-receiving elements, each of which is formed over different substrates, correspond to one light-emitting element formed over another substrate, light signals can be simultaneously sent to a plurality of substrates.

Figure 3B:
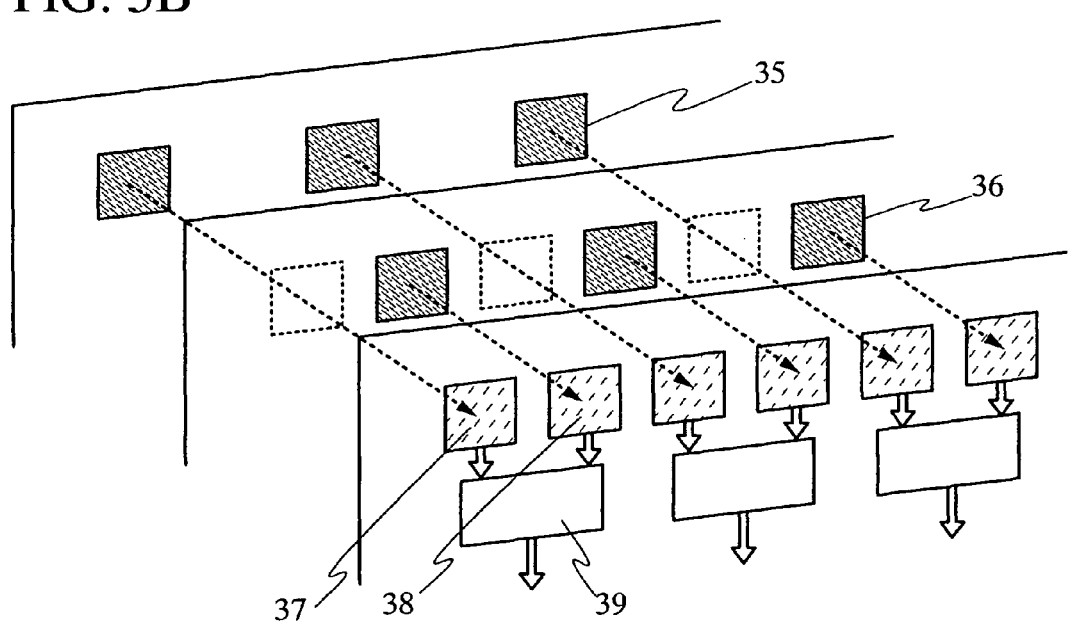

FIG. 3B shows the state in which a select circuit for selecting some electrical signals obtained in a plurality of light-receiving elements and sending the selected electrical signals to another circuit such as an amplify circuit in a light input unit or to an interface is provided. In FIG. 3B, light signals from both light-emitting element 35 and light-emitting element 36, each of which is formed over different substrates, are converted into electrical signals at two light-receiving elements 37, 38 formed over another substrate. Any one of the obtained two electrical signals is selected by a select circuit 39 to send to a circuit of a subsequent stage. Accordingly, as in the case with FIG. 3A, oscillation frequency per one light-emitting element and a load of a light-emitting element driving unit for controlling the drive of the light-emitting element can be reduced.

In order to transmit data by a light signal in parallel between glass substrates, the path of a light signal is required to be independent respectively. Therefore, use of high directional laser light is highly efficient to prevent cross talk. Hereinafter, the structure of an organic electroluminescent device used as a light-emitting element in a semiconductor device according to the invention will be explained.

Figure 4:
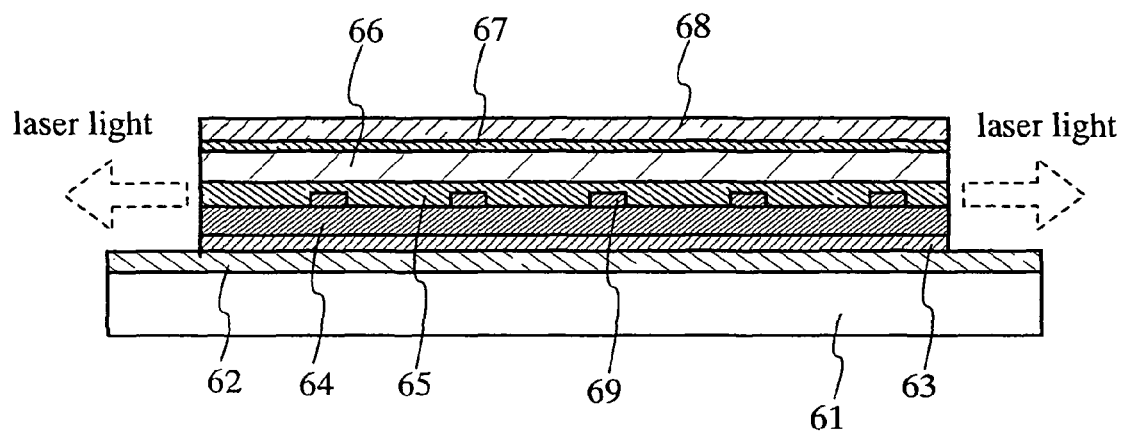
FIG. 4 is a cross-sectional view for showing an organic electroluminescent device used as a light-emitting element according to the present invention.

FIG. 4 is a cross-sectional view for showing an organic electroluminescent device used in a semiconductor device according to the invention. As a substrate 61, a substrate other than a glass substrate such as a plastic substrate can be used as long as it is transparent to light and can stand a processing temperature for forming a semiconductor element or another process. An anode 62 is formed on the substrate 61. Here, a longitudinal resonance mode is applied. Only light-emitting components parallel to a film surface is focused with respect to light amplification due to resonance. Therefore, transmittance and reflectance can be ignored and so work functions may be selected as a main parameter. Specifically, metals having large work functions such as Ag, Pt, Au, or the like, or alloys may be used. Of course, ITO or ZnO that is a transparent electrode having large work function can be used. In consideration of light emitted from a face of the semiconductor device, an electrode that is not transparent to light is preferably used.

An electroluminescent layer is formed over an anode 62. The electroluminescent layer has a hole injecting layer 63 having a high hole injection property from the anode 62; a hole transporting layer 64 for transporting holes from the hole injecting layer 63 to a light-emitting layer 65; an electron injecting layer 67 having a function of reducing an electron injection barrier of electrons from a cathode 68; and an electron transporting layer 66 for transporting efficiently injected electrons to the light-emitting layer 65. Injected carriers (holes and electrons) are recombined within the light-emitting layer 65. An emission mechanism in which carriers are injected, transported, and recombined is the same as in the case with the general organic electroluminescent device. Therefore, materials that can be used for the general organic electroluminescent device can be used for the foregoing each functional layer. In addition, five functional layers are used as an electroluminescent layer in Embodiment 1, but the invention is not limited thereto. The number of layers can be reduced by forming one layer to have a plurality of functions. The electroluminescent layer and the foregoing anode 62 can be formed to have appropriate thicknesses to emit light efficiently. The cathode 68 is formed over the electron injecting layer 67. Materials for the cathode 68 can be selected mainly by work functions as parameter without taking in consideration of translucency or reflectance.

As hole injection materials for the hole injecting layer 63, materials having small ionization potential, which is classified broadly into metal oxides, low molecular organic compounds, and high molecular compounds. As examples of the metal oxides, vanadium oxides, molybdenum oxides, ruthenium oxides, aluminum oxides, and the like can be used. As examples of the low molecular organic compounds, starburst amine typified by m-MTDATA, metallophthalocyanine, and the like can be used. As examples of the high molecular compounds, conjugated polymer such as polyaniline or polythiophene derivatives can be nominated. By using the foregoing materials as the hole injecting layer 63, a hole injecting barrier is reduced to inject holes effectively.

As materials for the hole transporting layer 64, known materials such as aromatic amine can be preferably used. For example, 4,4'-bis[N-(1-naphthyl)-N-phenyl-amino]-biphenyl (abbreviated α-NPD), 4,4',4''-tris(N,N-diphenyl-amino)-triphenyl amine (abbreviated TDATA), or the like can be used. As high molecular materials, poly(vinyl carbazole) having an excellent hole transportation property, or the like can be used.

As the light-emitting layer 65, a metal complex such as tris(8-quinolinolate) aluminum (abbreviated $Alq_3$), tris(4-methyl-8-quinolinolate) aluminum (abbreviated $Almq_3$), bis (10-hydroxybenzo[η]-quinolinote) beryllium (abbreviated $BeBq_2$), bis(2-methyl-8-quinolinolate)-(4-hydroxy-biphenylyl)-aluminum (abbreviated BAlq), bis[2-(2-hydroxyphenyl)-benzooxazolate]zinc (abbreviated $Zn(BOX)_2$), bis [2-(2-hydroxyphenyl)-benzothiazolate]zinc (abbreviated $Zn(BTZ)_2$), or the like can be used. Alternatively, various types of fluorescent dye can be used. Further, phosphorescent materials such as a platinum octaethylporphyrin complex, a tris(phenylpyridine)iridium complex, or a tris(benzylideneacetonato)phenanthrene europium complex can be efficiently used. Since a phosphorescent material has longer excitation lifetime than that of fluorescent material, population inversion, that is, the state in which the number of molecules in an excited state is larger than that in a ground state, becomes to be formed easily, which is essential to laser oscillation.

In addition, light-emitting materials can be used as dopant in the foregoing light-emitting layer 65. Therefore, a material having larger ionization potential and band gap than those of the light-emitting material can be used as a host material, and a small amount of the foregoing light-emitting material (approximately from 0.001% to 30%) can be mixed into the host material.

Known materials can be used for the electron transporting layer 66. Specifically, a metal complex having a quinoline skeleton or a benzoquinoline skeleton typified by tris(8-quinolinolate)aluminum (abbreviated $Alq_3$) or a mixed ligand complex thereof. Alternatively, other than the metal complex, an oxadiazole derivative such as 2-(4-biphenyl)-5-(4-tert-butylphenyl)-1,3,4-oxadiazole (abbreviated PBD), or 1,3-bis[5-(p-tert-butylphenyl)-1,3,4-oxadiazole-2-yl]benzene (abbreviated OXD-7), a triazole derivative such as 3-(4-tert-butylphenyl)-4-phenyl-5-(4-biphenylyl)-1,2,4-triazole (abbreviated TAZ), or 3-(4-tert-butylphenyl)-4-(4-ethylphenyl)-5-(4-biphenylyl)-1,2,4-triazole (abbreviated p-EtTAZ), phenanthroline derivatives such as bathophenanthroline (abbreviated BPhen), or bathocuproin (abbreviated BCP) can be used.

As a material for the electron injecting layer 67, an alkali metal or alkaline earth metal salt such as calcium fluoride, lithium fluoride, or cesium bromide can be used. The cathode 68 is formed thereover. The cathode 68 may be formed by a metal having small work functions, an alloy, an electrical conductive compound, and mixture of the foregoing materials, each of which is used for the general organic electroluminescent devices. As specific examples of the cathode material, an element of group 1 or 2 in the periodic table, that is, an alkali metal such as Li, Cs, or the like; an alkali earth metal such as Mg, Ca, Sr, or the like; an alloy containing the foregoing materials (Mg/Ag, Al/Li); or a transition metal containing a rare earth metal can be used. Alternatively, the cathode 68 can be formed by stacking a metal such as Al, Ag, or ITO (including alloys) with the foregoing materials. In addition, a resonator structure is required between the anode and the reflector over the cathode in order to resonate light emission obtained from a light-emitting layer in Embodiment 1. Therefore, as a cathode material, a metal having poor absorption of visible light and high reflectance is preferably used. Specifically, Al, Mg, or an alloy of Al and Mg is preferably used. The cathode is required to have such thickness that does not transmit light since the cathode has preferably reflectance of almost 100%.

The foregoing organic materials can be applied with either wet or dry process. In case of using high molecular materials, spin coating, ink jetting, dip coating, printing, or the like can be appropriately used. On the other hand, in case of using low molecular materials, not only dip coating or spin coating, but also vapor deposition can be used. The anode material and the cathode material may be applied with vapor deposition, sputtering, or the like.

In Embodiment 1, laser is oscillated from the edge surface of an electroluminescent layer. Therefore, the electroluminescent layer can be formed to have a short width. Consequently, it is sufficient that the electroluminescent layer has generally a width of several μm and a length of several hundreds μm. The important thing is control of a plurality of longitudinal modes. In the case that laser is oscillated in a lateral direction of the electroluminescent layer, a number of longitudinal modes are generated since a wavelength is shorter than the general length of the electroluminescent layer. Consequently, a number of longitudinal modes are generated. In view of the foregoing, a diffraction grating 69 is formed in the vicinity of the light-emitting layer 65 as shown in FIG. 4. For example, the top surface of the hole transporting layer 64 is not formed to be flat but in stripes to form the diffraction grating 69 in FIG. 4. The light emission generated in the light-emitting layer 65 gives rise to reflection periodically in accordance with the grid interval of the diffraction grating 69 to be resonated and amplified. As a result, exceedingly monochromatic light can be amplified. Let the refractive index of the electroluminescent layer be n, and let the oscillation wavelength be λ, the grid interval (λ/2n) may be formed.

Accordingly, single longitudinal mode can be realized to obtain exceedingly monochromatic output of the laser from the edge surface of an electroluminescent layer.

Then, the structure for changing the direction of laser light obtained from the organic electroluminescent device into the direction crossing to a substrate in case of using an organic electroluminescent device shown in FIG. 4 as a light-emitting element of a semiconductor device will be explained.

Figure 5A:
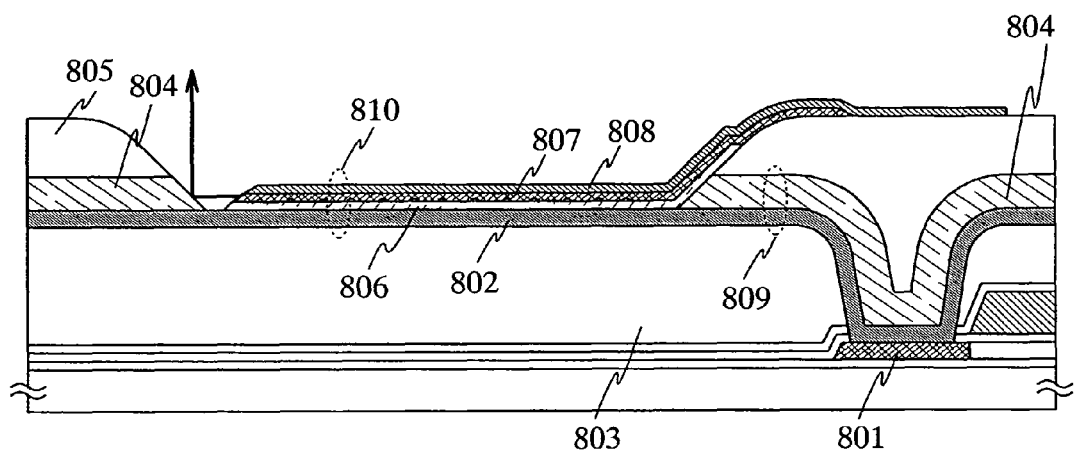
FIGS. 5A and 5B are cross-sectional views for showing a semiconductor display device.

FIG. 5A is a cross-sectional view of an organic electroluminescent device. As shown in FIG. 5A, an interlayer insulating film 803 is formed so as to cover a TFT which applies current to the organic electroluminescent device. The interlayer insulating film 803 has an opening portion where an impurity region 801 of the TFT is in contact with a wiring 809 formed over the interlayer insulating film 803.

The wiring 809 is formed by stacking a plurality of conductive films. In Embodiment 1, the wiring 809 is formed by stacking sequentially a first conductive film 802 formed by TaN and a second conductive film 804 formed by Al. Materials for the first conductive film 802 and the second conductive film 804 are not especially limited. However, the second conductive film 804 is formed by the material that does not transmit light but reflect.

An organic resin film is formed so as to cover the wiring 809 and etched partly to form a bank 805 having an opening portion. The conductive film 804 of the wiring 809 is partly etched with etching the organic resin film to expose a portion of the first conductive film 802.

Thereafter, an anode 806 and an electroluminescent layer 807 are formed at the opening portion of the bank 805. In Embodiment 1, the electroluminescent layer 807 is formed so as to expose a portion of the second conductive film 804 at the edge of the opening portion of the bank 805; however, the second conductive film 804 can be completely covered by the electroluminescent layer 807 so as not to be exposed.

A cathode 808 is formed over the electroluminescent layer 807. As a material for the cathode 808, AlLi is used in Embodiment 1. An organic electroluminescent device 810 is formed at the region where the anode 806, the electroluminescent layer 807, and the cathode 808 are overlapped with each other.

In the edge of the opening portion of the bank 805, the cathode 808 is deposited to expose the electroluminescent layer 807 partly in order light to reflect off the second conductive film 804 and emit upward. Accordingly, laser light generated in the electroluminescent layer 807 is emitted from an exposed portion of the electroluminescent layer 807 at the edge of the opening portion of the bank 805, and the laser light reflects off the second conductive film 804 at the edge of the opening portion of the bank 805. Consequently, excellent directional light can be obtained.

In order to prevent electroluminescent layer 807 from deteriorating, a thin metal film that can transmit a certain degree of light or another film that can transmit light may be formed not to expose completely the region from which light is emitted but to cover the region so as to prevent water or moisture from penetrating into the electroluminescent layer 807.

Figure 5B:
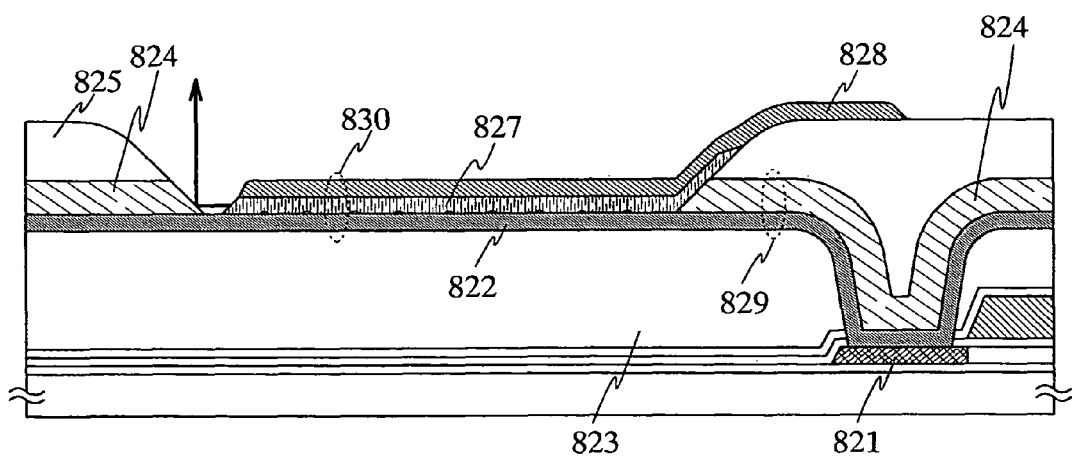

FIG. 5B is a cross-sectional view of an organic electroluminescent device, which is different from that shown in FIG. 5A. As shown in FIG. 5B, an interlayer insulating film 823 is formed so as to cover a TFT which applies current to the organic electroluminescent device. The interlayer insulating film 823 has an opening portion where an impurity region 821 of the TFT is in contact with a wiring 829 formed over the interlayer insulating film 823.

The wiring 829 is formed by stacking a plurality of conductive films. In Embodiment 1, the wiring 829 is formed by stacking sequentially a first conductive film 822 formed by TiN or Ti and a second conductive film 824 formed by Al. Materials for the first conductive film 822 and the second conductive film 824 are not especially limited. However, a material having large work function which is sufficient for an anode is used since the second conductive film 824 is utilized partly as an anode of an organic electroluminescent device.

An organic resin film is formed so as to cover the wiring 829 and etched partly to form a bank 825 having an opening portion. The second conductive film 824 of the wiring 829 is partly etched with etching the organic resin film to expose a portion of the first conductive film 822.

Thereafter, an electroluminescent layer 827 is formed at the opening portion of the bank 825. In Embodiment 1, the electroluminescent layer 827 is formed so as to expose a portion of the second conductive film 824 at the edge of the opening portion of the bank 825; however, the second conductive film 824 can be completely covered by the electroluminescent layer 827 so as not to be exposed.

A cathode 828 is formed over the electroluminescent layer 827. As a material for the cathode 828, AlLi is used in Embodiment 1. An organic electroluminescent device 830 is formed at the region where the wiring 829 serving as an anode, the electroluminescent layer 827, and the cathode 828 are overlapped with each other.

The cathode 828 is deposited to expose the electroluminescent layer 827 partly in order light to reflect off the second conductive film 804 and emit upward at the edge of the opening portion of the bank 825. Accordingly, laser light generated in the electroluminescent layer 827 is emitted from an exposed portion of the electroluminescent layer 827 at the edge of the opening portion of the bank 825, and the laser light reflects off the second conductive film 824 at the edge of the opening portion of the bank 825. Consequently, excellent directional light can be obtained.

In order to prevent electroluminescent layer 827 from deteriorating, a thin metal film that can transmit a certain degree of light or another film that can transmit light may be formed not to expose completely the region from which light is emitted but to cover the region so as to prevent water or moisture from penetrating into the electroluminescent layer 827.

In the organic electroluminescent device explained in Embodiment 1, light generated in an electroluminescent layer is emitted from, but not exclusively, an opening portion formed at an anode. Light can be emitted from an opening portion formed at a cathode.

Further, an anode and a cathode of the organic electroluminescent device can be formed by a material capable of transmitting light. Alternatively, the anode or the cathode can be formed by the material that does not transmit light and reflects light in order not to prevent light signals to be sent and received using longitudinal laser light due to the light got out of the anode side and the cathode side. In addition, in case that the anode or the cathode is formed by a material capable of transmitting light, hindrance to sending and receiving light signals using longitudinal laser light can be prevented by forming a film that can shield light (light-shielding film) got out of the anode side and the cathode side.

Further, in case of using excellent directional laser light as a light signal, there is the possibility that cross talk is occurred depending on the refraction index of medium of the path of the light signal. Therefore, the layout of a light-receiving element and a light-emitting element, the thickness of a substrate, the distance between substrates, the medium between substrates, and the like are appropriately set preferably in consideration of preventing cross talk. In order to prevent cross talk, a light guide such as an optical fiber having a cylindrical cross section or a cross section which is close to a cylindrical shape, or a thin film waveguide for guiding light along a planate dielectric thin film can be provided to a path of a light signal.

As a substrate for a semiconductor device, a substrate other than a glass substrate such as a plastic substrate can be used as long as it transmits light and can stand a processing temperature for forming a semiconductor element or another process.

EMBODIMENT 2

Figure 17:
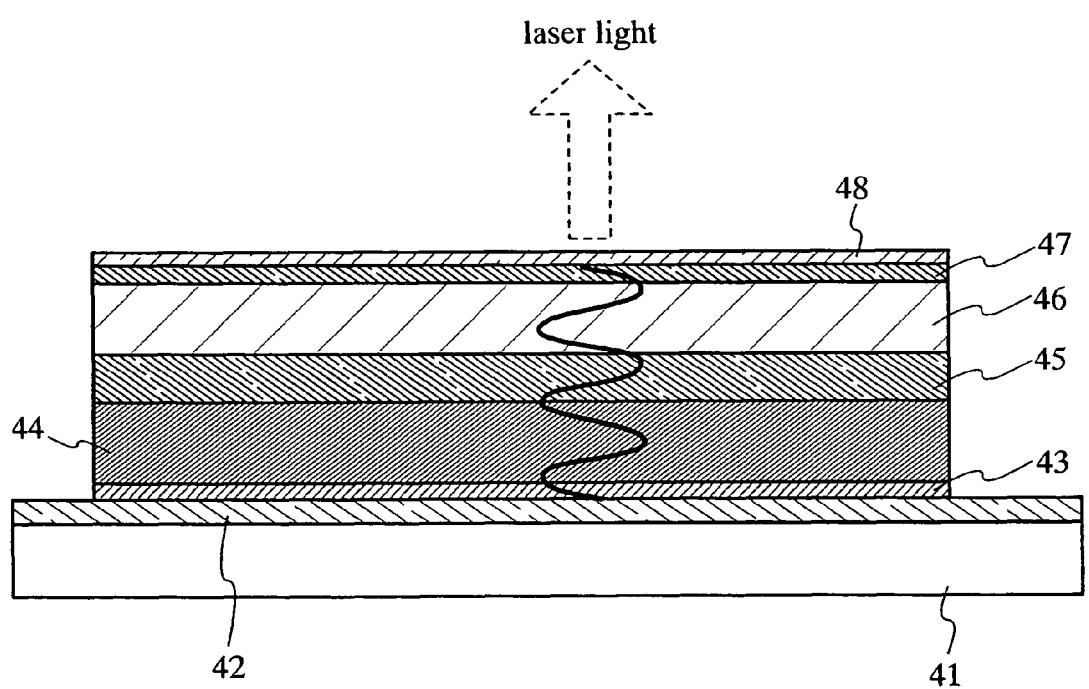
FIG. 17 is a cross-sectional view for showing an organic electroluminescent device used as a light-emitting element according to the invention.

A structure in which laser light is emitted from the electrode which is over an anode on a substrate, namely, a cathode, will be explained in Embodiment 2. In FIG. 17, reference numeral 41 denotes a substrate, which is formed by any materials. Not only glass, quartz, plastic, but also a flexible substrate such as paper or cloth can be used. Of course, the substrate is not required to be transparent.

Reference numeral 42 denotes an anode. The anode injects holes to an electroluminescent layer and serves as a reflector. Therefore, a material that has poor absorption properties of visible light, high reflectivity, and a large work function (at least 4.0 eV) is required. As a material that meets the foregoing conditions, Ag, Pt, Au, or the like can be used. In addition, since the anode is used as a reflector, the electrode is required to have the thickness that does not transmit visible light. Specifically, the electrode may be formed to have a thickness of from several ten nm to several hundreds nm.

The same structure as an organic electroluminescent device, which can emit light upon application of current, can be provided over the anode 42. That is, a hole injecting layer 43, a hole transporting layer 44, a light-emitting layer 45, and an electron transporting layer 46 are provided. Theses layers may be formed by known materials as explained in Embodiment 1. An electron injecting layer 47, which is preferably formed by organic compounds doped with alkali metals such as Li or Ce, is formed over the electron transporting layer 46. Electron transporting materials explained in Embodiment 1 can be used in combination with the organic compounds. Thereafter, a cathode 48 is formed. The cathode 48 may be formed by a known material as explained in Embodiment 1. Alternatively, MgAg alloys having an excellent electron injection property can be stacked directly instead of forming the electron injecting layer 47. In this instance, since laser light is emitted from a top surface, the cathode 48 serves as an output mirror. Therefore, the cathode is formed to have transmittance of from 50% to 95% for the laser light. For example, an MgAg alloy is formed to have a thickness of from 10 nm to 20 nm.

The interval between the reflector over the anode 42 and the cathode 48 is required to be integral multiple of a half wavelength for forming a stationary wave to amplify light. For example, in order to amplify light at 400 nm, an interval at least 200 nm is required. Similarly, in order to amplify light at 800 nm, an interval of 400 nm is required. The emission wavelength of the foregoing organic light-emitting materials is mainly in a visible light region. Therefore, in order to amplify the visible light defined as from 400 nm to 800 nm, the interval between the reflector and the cathode 48, that is, the film thickness of a functional layer is required to have a thickness of at least 200 nm. In addition, since it should consider that light speed is less for the refraction index of a material, it is required that the value obtained by dividing the film thickness by a refraction index is at least 200 nm.

By applying current to thus obtained organic electroluminescent device according to Embodiment 2, light emitted from an electroluminescent layer is amplified by induced radiation and resonated between the cathode 48 and the anode 42. Consequently, laser light can be emitted from a top surface of a device (a cathode side).

In Embodiment 2, the structure in which laser light is emitted from a cathode side is explained; however, the invention is not limited thereto. An organic electroluminescent device in which laser light can be emitted from an anode side can be used as a light-emitting element for generating a light signal.

EMBODIMENT 3

An embodiment mode of an organic electroluminescent device will be explained.

Figure 16A:
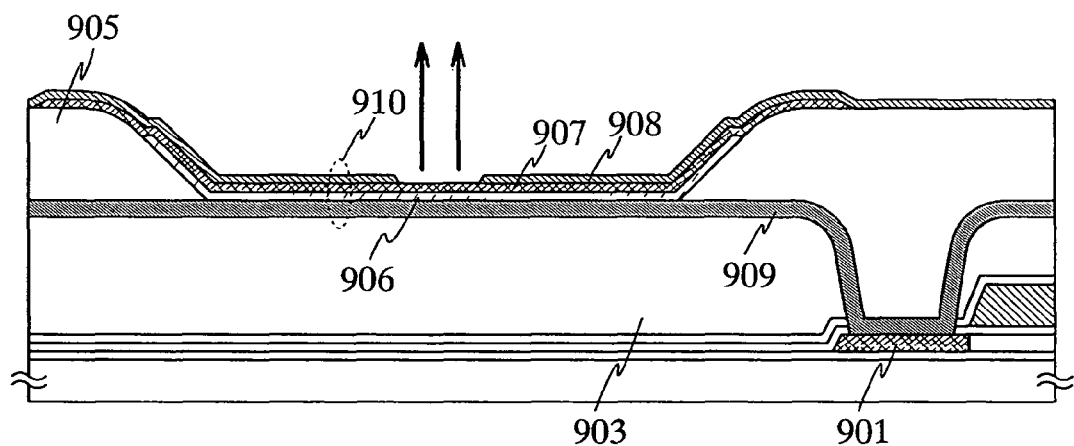
FIGS. 16A and 16B are cross-sectional views for showing an organic electroluminescent device used as a light-emitting element according to the invention.

FIG. 16A is a cross-sectional view of an organic electroluminescent device. In FIG. 16A, an interlayer insulating film 903 is formed so as to cover a TFT that applies current to the organic electroluminescent device. The interlayer insulating film 903 has an opening portion. An impurity region 901 of the TFT is in contact with a wiring 909 formed over the interlayer insulating film 903 in the opening portion.

The wiring 909 is formed by the conductive material that does not transmit light and reflects light. In this embodiment, the wiring 909 is formed by Al. The material for the cathode is not limited to Al. Any material can be used as long as it does not transmit light and reflects light.

An organic resin film is formed so as to cover the wiring 909 and etched partly, to form a bank 905 having an opening portion. Thereafter, an anode 906 and an electroluminescent layer 907 are formed at the opening portion of the bank 905. A cathode 908 is formed over the electroluminescent layer 907. As a material for the cathode 908, AlLi is used in Embodiment 3. An organic electroluminescent device 910 is formed at the region where the anode 906, the electroluminescent layer 907, and the cathode 908 are overlapped with each other.

In the opening portion of the bank 905, the cathode 908 is formed to have an opening portion at the region where the electroluminescent layer 907 and the wiring 909 are overlapped with each other to expose partly the electroluminescent layer 907 at the opening portion. Accordingly, light generated in the electroluminescent layer 907 gives rise to reflection between the wiring 909 and the cathode 908 to emit from the exposed portion of the electroluminescent layer 907. Consequently, excellent directional laser light can be obtained.

In order to prevent electroluminescent layer 907 from deteriorating, a thin metal film that can transmit a certain degree of light or another film that can transmit light may be formed not to expose completely the region from which light is emitted but to cover the region so as to prevent water or moisture from penetrating into the electroluminescent layer 907.

Figure 16B:
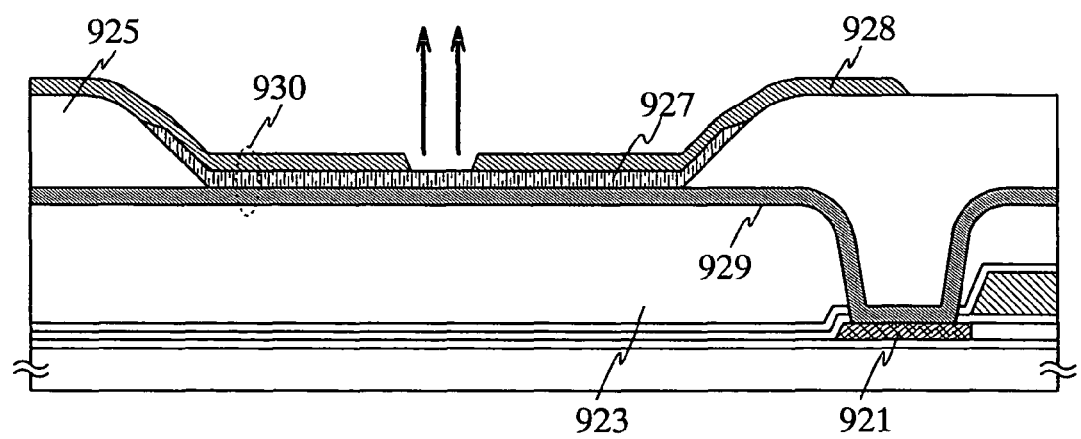

FIG. 16B is a cross-sectional view of an organic electroluminescent device, which is different from that shown in FIG. 16A. As shown in FIG. 16B, an interlayer insulating film 923 is formed so as to cover a TFT that applies current to the organic electroluminescent device. The interlayer insulating film 923 has an opening portion. An impurity region 921 of the TFT is in contact with a wiring 929 formed over the interlayer insulating film 923 in the opening portion.

The wiring 929 is formed by the conductive material that does not allow light to pass therethrough and reflects light. In Embodiment 3, the wiring 929 is formed by TiN or Ti. The material for using the cathode is not limited to TiN or Ti. Any material can be used as long as it does not transmit light and reflects light. However, a material having large work function which is sufficient for an anode is used since the wiring 929 is utilized partly as an anode of an organic electroluminescent device.

An organic resin film is formed so as to cover the wiring 929 and etched partly to form a bank 925 having an opening portion. Thereafter, an electroluminescent layer 927 is formed at the opening portion of the bank 925. Then, a cathode 928 is formed over the electroluminescent layer 927. As a material for the cathode 928, AlLi is used in Embodiment 3. An organic electroluminescent device 930 is formed at the region where the wiring 929 serving as an anode, the electroluminescent layer 927, and the cathode 928 are overlapped with each other.

In the opening portion of the bank 925, the cathode 928 is formed to have an opening portion at the region where the electroluminescent layer 927 and the wiring 929 are overlapped with each other to expose partly the electroluminescent layer 927 at the opening portion. Accordingly, light generated in the electroluminescent layer 907 gives rise to reflection between the wiring 929 and the cathode 928 to emit from the exposed portion of the electroluminescent layer 927. Consequently, excellent directional laser light can be obtained.

In order to prevent electroluminescent layer 927 from deteriorating, a thin metal film that can transmit a certain degree of light or another film that can transmit light may be formed not to expose completely the region from which light is emitted but to cover the region so as to prevent water or moisture from penetrating into the electroluminescent layer 927.

In the organic electroluminescent device explained in Embodiment 3, light generated in an electroluminescent layer is emitted from, but not exclusively, an opening portion formed at an anode. Light can be emitted from an opening portion formed at a cathode.

In the organic electroluminescent device explained in Embodiment 3, an opening portion is formed at an anode or a cathode, and light generated in an electroluminescent layer is emitted from the opening portion. The directivity of light emitted from the light-emitting element can be improved by reducing the size of the opening portion of the bank.

Further, an anode and a cathode of the organic electroluminescent device can be formed by a material capable of transmitting light. Alternatively, the anode or the cathode can be formed by the material that does not transmit light and reflects light in order not to prevent light signals to be sent and received using longitudinal laser light due to the light got out of the anode side or the cathode side. In addition, in case that the anode or the cathode is formed by a material capable of transmitting light, hindrance to sending and receiving light signals using longitudinal laser can be prevented by forming a film that can shield light (light-shielding film) got out of the anode side and the cathode side.

Further, in case of using excellent directional laser light as a light signal, there is the possibility that cross talk is occurred depending on the refraction index of medium of the path of the light signal. Therefore, the layout of a light-receiving element and a light-emitting element, the thickness of a substrate, the distance between substrates, the medium between substrates, and the like are preferably set appropriately in consideration of preventing cross talk. In order to prevent cross talk, a light guide such as an optical fiber having a cylindrical cross section or a cross section which is close to a cylindrical shape, or a thin film waveguide for guiding light along a planate dielectric thin film can be provided to a path of a light signal.

As a substrate for a semiconductor device, a substrate other than a glass substrate such as a plastic substrate can be used as long as it can transmit light and can stand a processing temperature for forming a semiconductor element or another process.

EXAMPLE 1

In Example 1, an example in which CPU core of a CPU (Central Processing Unit) represented by a microprocessor is formed over a plurality of glass substrates to connect the substrates with each other by optical interconnection will be explained.

A TFT formed over a glass substrate operates at slower than a single crystal transistor. Accordingly, in the case that a CPU is formed over a glass substrate, it is difficult to execute processing at sufficient speed by a single CPU core when the processing is complicated. Consequently, series of processing of a CPU core are divided into some pieces of processing on a subjective basis, and one CPU core formed over a substrate is allocated to each processing. By connecting a plurality of substrates provided with each CPU core by optical interconnection, series of processing can be executed similar to the case of using single CPU core. CPU core formed over each substrate may execute only allocated processing; the processing speed is improved compared with the case that all processing is executed by single CPU core.

Figure 13:
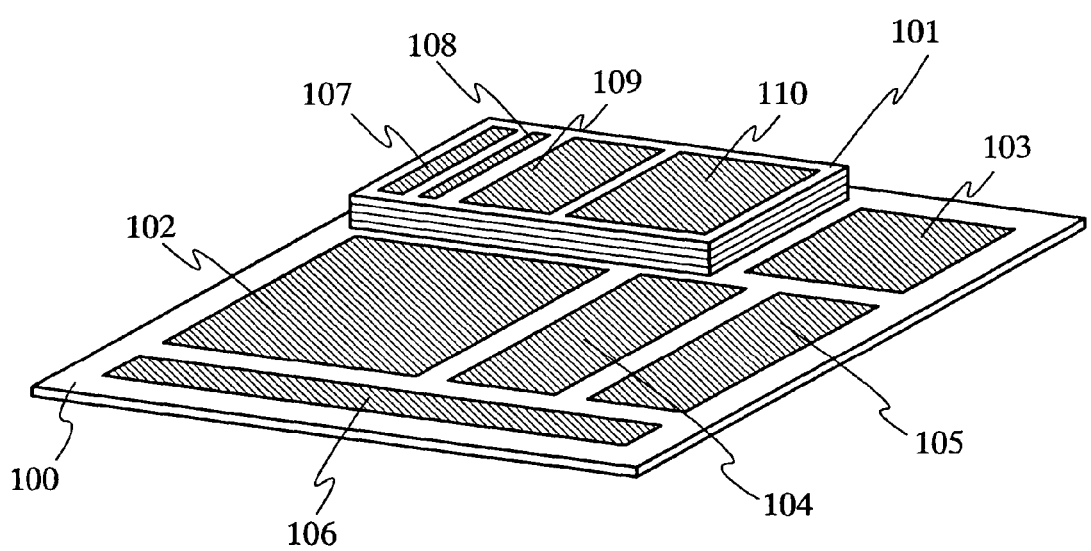
FIG. 13 is view for showing a microprocessor according to the invention.

FIG. 13 is a perspective view of a microprocessor according to Example 1. A microprocessor 100 is composed of a plurality of CPU core substrates 101 using glass substrates, a main memory 102, a clock controller 103, a cash controller 104, a serial interface 105, an I/O port 106, and the like. The microprocessor 100 shown in FIG. 13 is an example of a simplified illustration. A practical microprocessor has various configurations as usage.

The CPU core substrate 101 is formed by substrates that transmit light. In Example 1, a glass substrate is used for the CPU core substrate 101. Each the CPU core substrate 101 has an input/output portion 107, an interface 108, a CPU core 109, and a cash memory 110.

The input/output portion 107 may have both a light-emitting element which has the function of outputting an electrical signal as an optical signal, and a light-receiving element which has the function of converting an optical signal into an electric signal. Alternatively, the input/output portion 107 may have only either of them depending on a substrate. Further, the input/output portion 107 may have a terminal for sending and receiving an electric signal without converting it into an optical signal among another circuit composing the microprocessor 100.

The cash memory 110 is small-capacity and high-speed memories interposed between the CPU core 109 and the main memory 102. A high-speed CPU core requires high-speed memory. However, in the case that a high-capacity and high-speed memory having access time which is suitable for the operation speed of the CPU core 109 is used, the cost will be increased generally. The CPU core 109 becomes possible to be operated at high speed without depending on the speed of a main memory by accessing the cash memory.

An example of operation of each the CPU core 109 will be explained hereinafter.

For example, at the beginning of execution, a program is downloaded to a cash memory 110 (SRAM) of each the CPU core substrate 101 from the main memory 102 or another external memory, which may be carried out by the CPU core 109 serving as a master.

Then, each the CPU core 109 serving as a slave executes the program stored in the cash memory 110 of the same CPU core substrate 101 sequentially. The cash memory 110 of the same CPU core substrate 101 not only stores a program but also serves as a work region to store temporarily a calculation result or the like of the CPU core 109.

When each the CPU core 109 requires sending and receiving a signal such as an output result of the CPU core 109 or the main memory 102 to/from other than the cash memory 110 in the CPU core substrate 101, the sending and receiving is handled out via the input/output portion 107.

An entire operation speed is improved according to the number of the CPU core 109. Parallelization has more effects especially when there is a few handling of sending and receiving of a signal within the CPU core 109 or to/from the CPU core substrate 101.

As examples of programs, a program of applying a Monte Carlo method or simulated annealing to an optimization problem in which the minimum value is explored within phase space having a great many minimal values (for example, an automatic routing problem, or a visitation problem of salesmen) or to validation of dispersion (a circuit simulation, or the like) can be nominated.

These programs have basically the configuration in which the same subprogram is executed at a number of times repeatedly and independently. Practically, by charging the different CPU core 109 with each subprogram, the CPU core 109 and the cash memory 110 in each the CPU substrate 101 can execute a completed program. Accordingly, an ideal parallel computing can be executed.

Further, when processing speeds between the CPU cores are different with each other, problems may be occurred. Therefore, the CPU core serving as a master may take the balance of the processing speed between the CPU cores serving as slaves.

EXAMPLE 2

Figure 7:
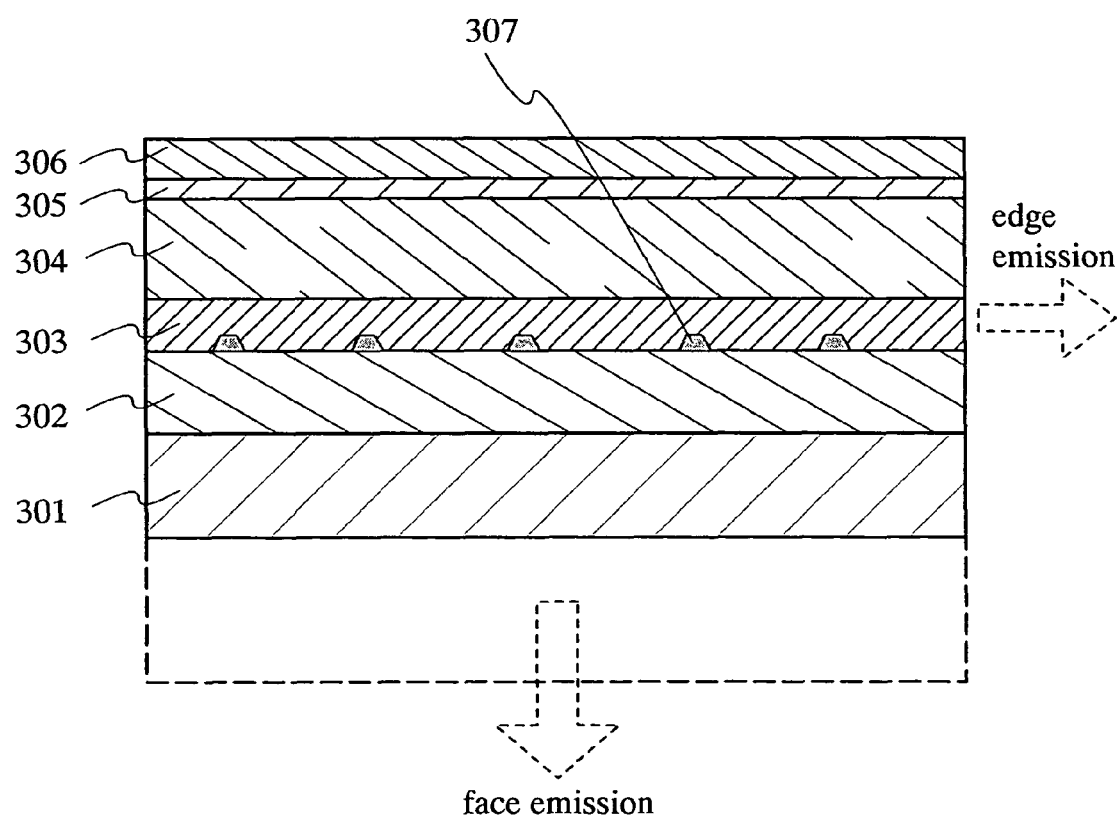
FIG. 7 is a cross-sectional view for showing an organic electroluminescent device used as a light-emitting element according to the invention.

FIG. 7 shows the device configuration of a sample manufactured according to Example 2. An ITO film is deposited by sputtering to have a thickness of 100 nm as an anode 301 over a support medium over which an electrode, a light-emitting layer, and the like are formed.

α-NPD is deposited thereover by vacuum vapor-deposition to have a thickness of 135 nm as a hole transporting layer 302. Then, diffraction gratings 307 are formed over the hole transporting layer 302, and then, a light-emitting layer 303 is formed to have a thickness of 30 nm by co-evaporation of 4,4'-bis(N-carbazolyl)-biphenyl (hereinafter, CBP) as a host material and an iridium complex, Ir(tpy)$_2$(acac), which is a triplet light-emitting material. The weight ratio of the CBP and the iridium complex is 10:1. BCP, calcium fluoride (CaF$_2$), and aluminum (Al) are deposited sequentially over these films as an electron transporting layer 304, an electron injecting layer 305, and a cathode 306, respectively. Therefore, a sandwich device configuration is completed. Further, a designer can appropriately determine the size of an organic electroluminescent device used practically for a semiconductor device. In Example 2, the organic electroluminescent device has the size of 2 mm×2 mm tentatively.

The film thickness of each layer formed by organic materials is determined so as to amplify generated light in an electroluminescent layer. Therefore, the light emission from the Ir complex which is added to the CBP layer or the α-NPD layer forms preferably a stationary wave by giving rise to reflection repeatedly at the interface between the ITO and the electroluminescent layer, the interface between the BCP layer and the CaF$_2$ layer, or the interface between the CaF$_2$ layer and Al layer.

Materials capable of emitting light are the Ir complex and the α-NPD in the organic materials used according to the Example 2. These materials give light emission in a visible light region (400 nm to 800 nm). In order to form a stationary wave, the intervals between the diffraction gratings are required to be the integral multiple of a half wavelength. For example, in order to form a stationary wave of light at 400 nm, the intervals between the diffraction gratings are required to be 200 nm or the integral multiple thereof. That is, the intervals between the diffraction gratings are required to be integral multiple of 200 nm, such as 200 nm, 400 nm, or 600 nm. Similarly, in order to form a stationary wave of light at 800 nm, the intervals between the diffraction gratings are required to be integral multiple of 400 nm, such as 400 nm, 800 nm, or 1200 nm.

An organic electroluminescent device shown in FIG. 7 includes an electroluminescent layer having, but not exclusively, a total thickness of 270 nm. In the case of the organic electroluminescent device shown in FIG. 7, given that the refractive index of organic compounds is 1.7, the wavelength of light capable of forming a stationary wave is the one that is divided 920 nm by integer, that is, 460 nm in a visible light region.

Figure 8A:
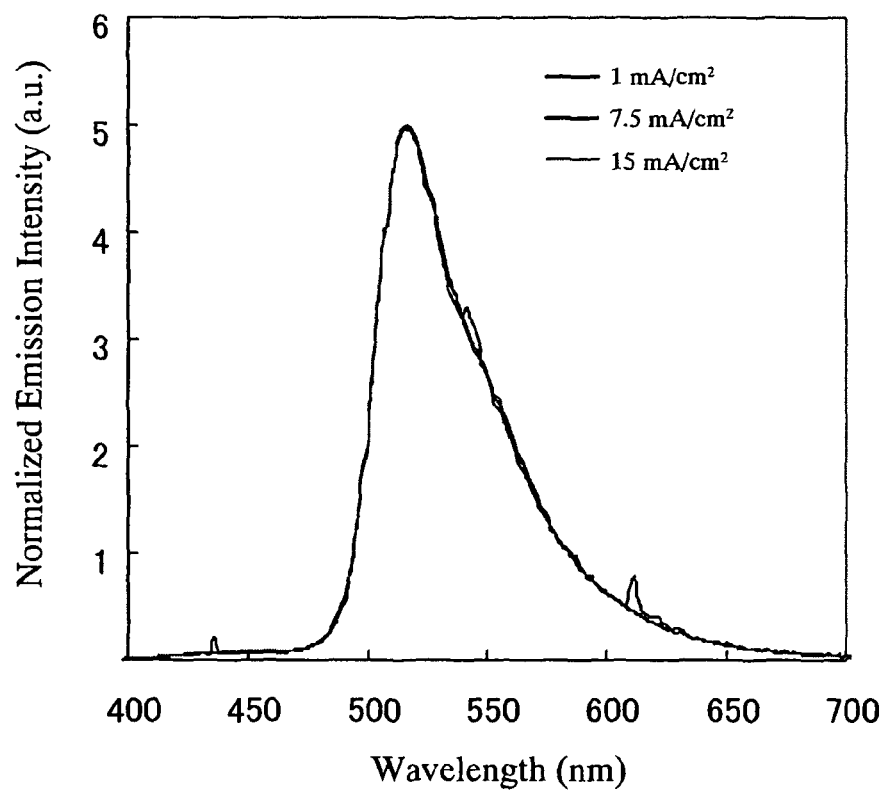
FIGS. 8A and 8B are emission spectra of an organic electroluminescent device having the structure illustrated in FIG. 7.
Figure 8B:
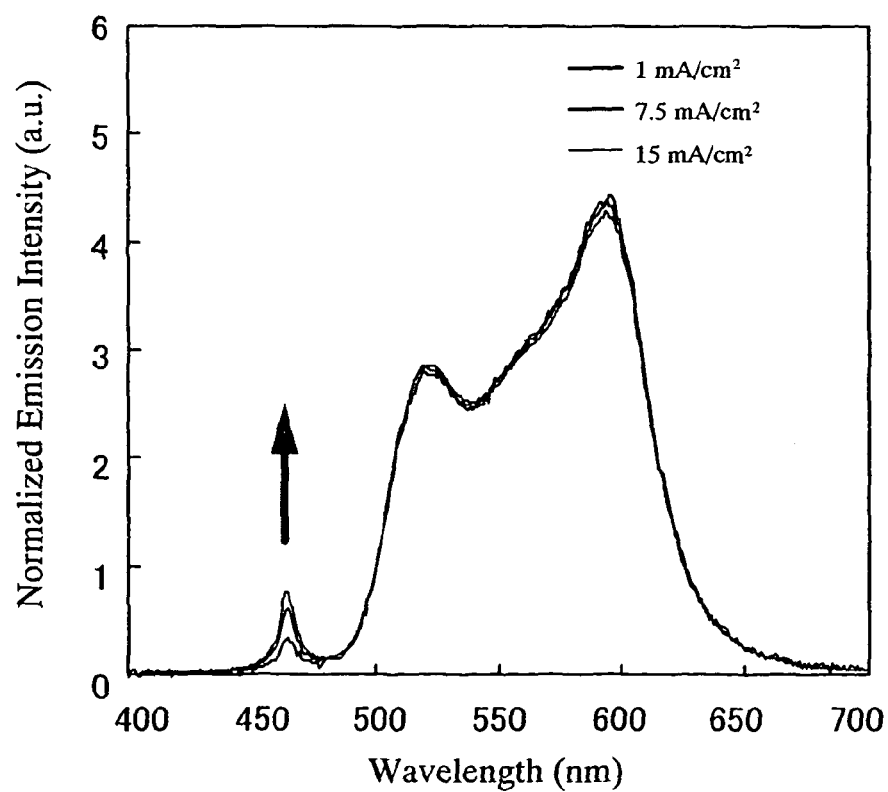

FIGS. 8A and 8B are the emission spectra of an organic electroluminescent device having the device configuration shown in FIG. 7. In the both spectra, the intensity is normalized. FIG. 8A is an emission spectrum of a face emission observed from an ITO side. FIG. 8B is an emission spectrum of an emission observed from the edge of the organic electroluminescent device. As shown in FIG. 8A, intense emission is observed at a wavelength band of from 475 nm to 650 nm. The emission is generated from the Ir complex. Further, another emission is observed around from 400 nm to 475 nm. The emission is generated from the α-NPD.

From the result, it can be considered that carriers (holes and electrons) are recombined each other almost always in the CBP layer to excite the light emission from the Ir complex; however, a part of carriers are recombined in the α-NPD layer. In the face emission, emission intensity varies depending on the variation of a current density. Therefore, the spectra become to have identical forms at any current density, and only the intensity is increased linearly in proportion to the increase of a current density.

Compared to the spectrum shown in FIG. 8A, the emission spectrum observed from the edge of the organic electroluminescent device has two features as shown in FIG. 8B. The first feature is that the waveform of an emission spectrum in the wavelength band of from 475 nm to 650 nm is different from that in FIG. 8A. The second feature is that a sharp emission spectrum is observed around 460 nm. The reason of the former is not clear. On the contrary, the reason of the latter may be considered that a stationary wave is formed by the electroluminescent layer in the organic electroluminescent device, and only the light at the wavelength is amplified. Actually, as mentioned above, the wavelength which allows stationary wave is 460 nm in the organic electroluminescent device having the thickness. As the most characteristic feature, the intensity of the emission in the wavelength band of from 475 nm to 600 nm varies in proportion to the increase of a current density, on the contrary, the intensity of another emission spectrum having a peak at around 460 nm further increases than the increase of a current density. Therefore, in the normalized intensity shown in FIG. 8B, only emission at 460 nm is relatively increased.

Figure 9:
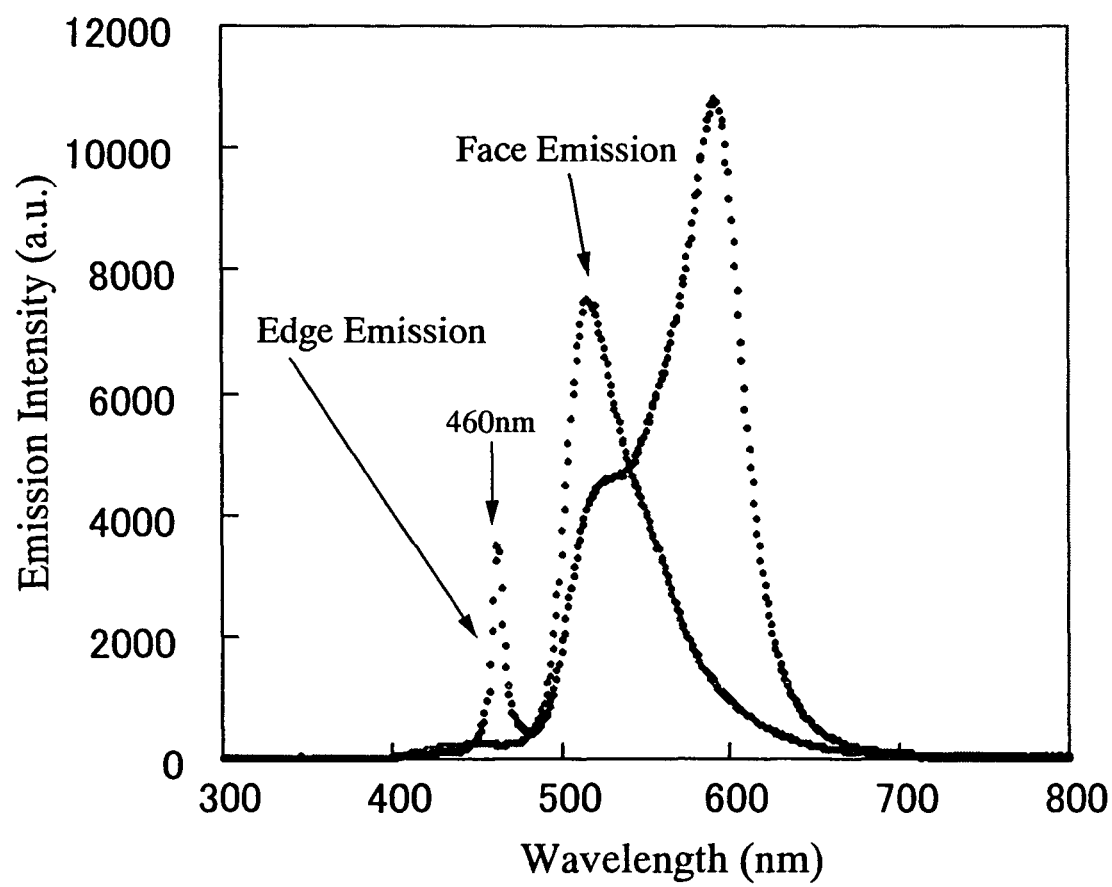
FIG. 9 is an emission spectrum of an organic electroluminescent device having the structure illustrated in FIG. 7.

Accordingly, it can be considered that the light at a wavelength of 460 nm in the organic electroluminescent device forms a stationary wave. Therefore, it can be said that the organic electroluminescent device serves as a resonator to amplify light at 460 nm. Further, when a current density is increased to 120 mA/cm$^2$, the spectrum form of face emission is not varied at all; on the contrary, the intensity of the light emission at 460 nm is further increased to give a sharp emission signal (FIG. 9).

Figure 10A:
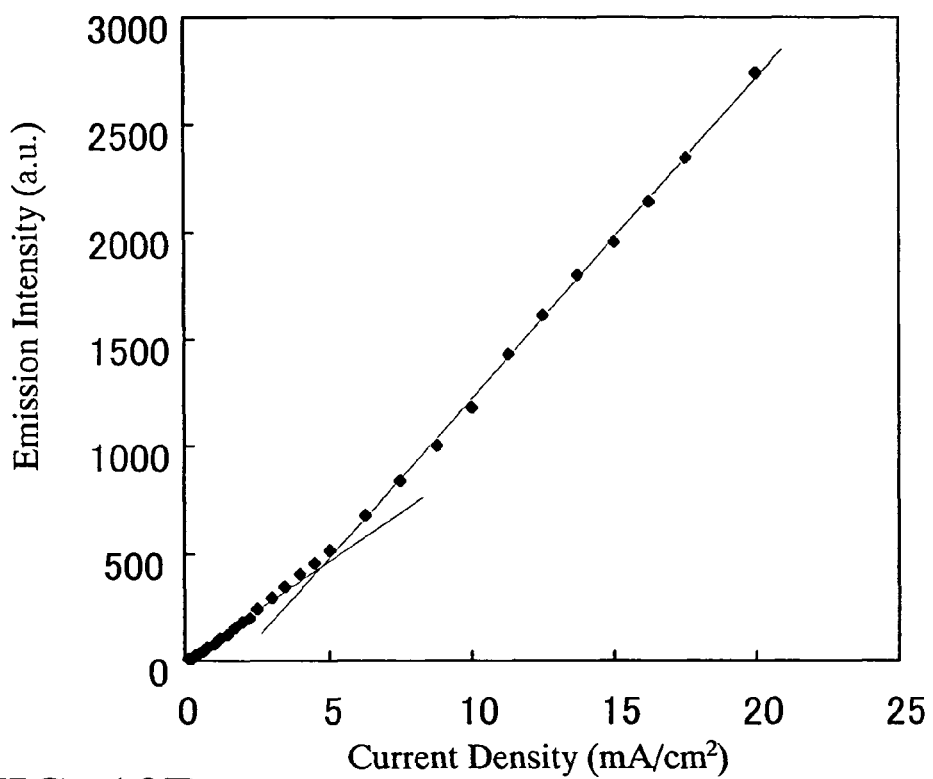
FIGS. 10A and 10B are plots showing emission intensity of light at 460 nm versus a current density.
Figure 10B:
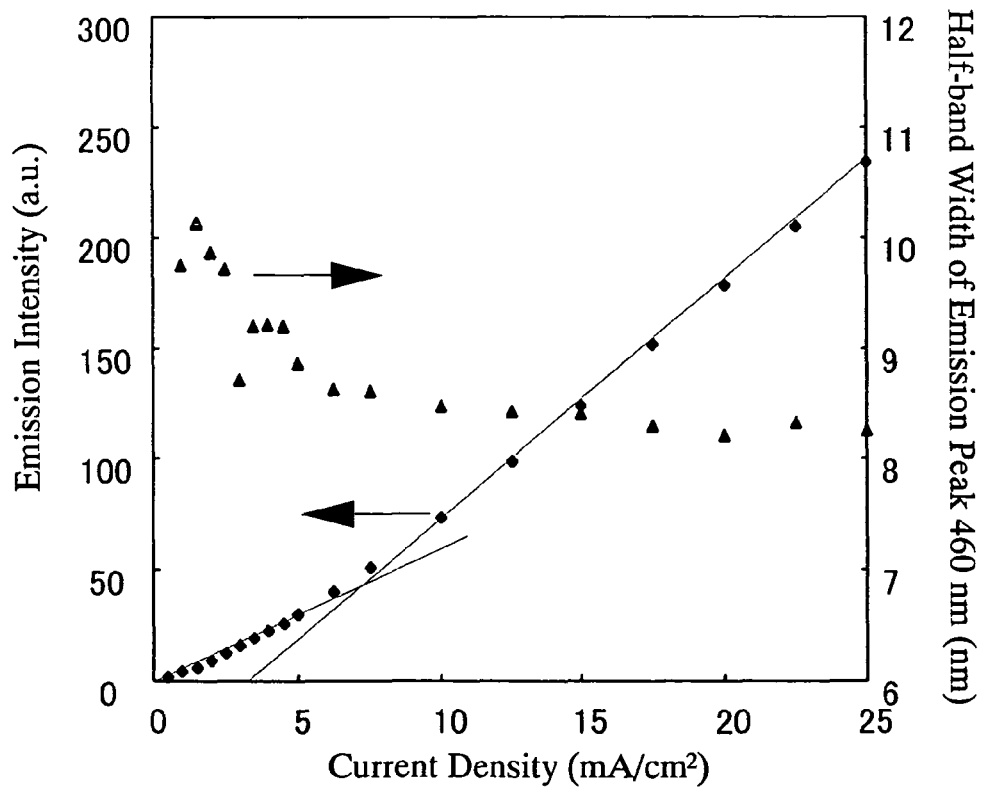

FIGS. 10A and 10B are plots showing emission intensity of light at 460 nm versus a current density. FIG. 10A shows a measurement result of light emission from the face of an organic electroluminescent device. FIG. 10B shows a measurement result of light emission from the edge of an organic electroluminescent device. In both properties, emission intensity is linearly increased with the increase of a current density. However, the increase is not monotonous. In each light emission, it is indicated that there is a threshold to vary the slope at a current density around 5 mA/cm$^2$ to 10 mA/cm$^2$. At this time, it can be considered that emission is spontaneous emission in the case that a current density is lower than a threshold, and emission is stimulated emission in the case that a current density is higher than a threshold.

FIG. 10B is a plot showing a half-band width of an emission spectrum having an emission peak at 460 nm versus a current density. The half-band width is decreased drastically until a current density reaches a threshold. After a current density reaches a threshold, the half-band width is decreased gradually. Further, emission from the edge of an organic electroluminescent device is measured at various angles in which there is no change in an emission wavelength. Accordingly, it can be considered that the decrease of a half-band width is not caused by the fact that refractive index is dependent on a wavelength. In other words, the fact that an emission spectrum seems sharp in appearance is not from the fact that only a fraction of a wavelength of emission is selectively focused to observe.

In either case of face emission or edge emission, a threshold can not be found in emission of from 475 nm to 650 nm. The emission in the wavelength band shows that the intensity is increased linearly with the increase of a current density, and the phenomenon that the increase ratio of emission is decreased in a high current region. The behavior is similar to the typical behavior of a general organic electroluminescent device. In addition, since the emission at 460 nm observed from the ITO side of the device gives a broad spectrum at any current density, the half-band width thereof can not be obtained.

Table 1 shows laser oscillation characteristics of a sample (a device) which is manufactured according to Example 2. Table 1 is the measurement result of three identical samples showing a peak wavelength of from 462 nm to 464 nm, a half-band width of at most 10 nm, and a threshold of from 10 $mA/cm^2$ to 12.5 $mA/cm^2$, respectively. These characteristics are measured at room temperature.

TABLE 1

Laser Oscillation Behavior of Manufactured Element

| Sample No. | Threshold ($mA/cm^2$) | Peak Wavelength (nm) | Half-band Width[1] (nm) |
|---|---|---|---|
| 1 | 12.5 | 464 | 8.0 |
| 2 | 10.0 | 462 | 8.0[2] |
| 3 | 11.0 | 463 | 9.1 |

[1]half-band width at current density of 50 $mA/cm^2$
[2]half-band width at current density of 60 $mA/cm^2$ Accordingly, the following conclusion can be drawn. In the organic electroluminescent device according to Example 2 has a resonator structure for light emission around 460 nm to form a stationary wave of light at the wavelength. In light emission at 460 nm, it is indicated that there is a threshold at a current density. The behavior is similar to that of a solid laser. In case that the threshold indicates that what is called population inversion is started, laser light is oscillated at a further large current density.

Figure 11:
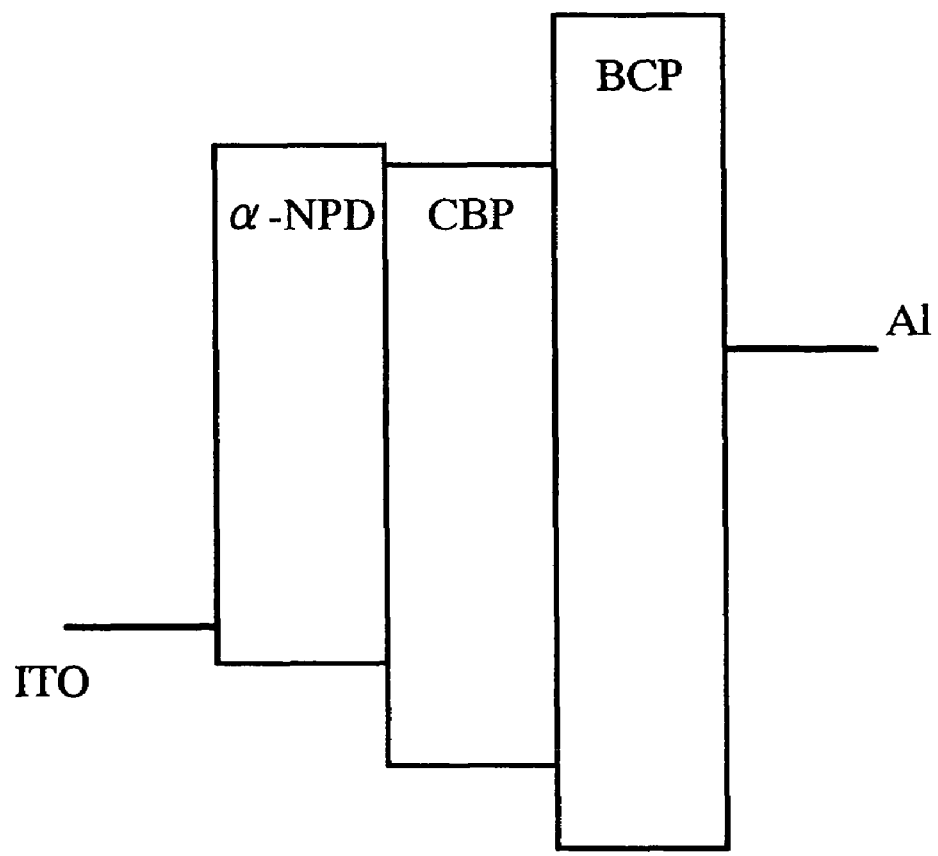
FIG. 11 is a band diagram showing an organic electroluminescent device.

The reason for oscillating laser light in such a way is explained with reference to band diagram in FIG. 11.

Holes are injected to α-NPD layer and transported into CBP layer that is added with Ir. Then, the holes are injected to the Ir. However, a certain amount of holes are presented in the α-NPD layer since there is an energy barrier between the α-NPD layer and the CBP layer. Most of the holes transported into the CBP layer do not come into BCP layer since an energy barrier is large.

Electrons injected to the BCP layer are transported into the CBP layer to inject to the Ir as dopant. Then, the holes and the electrons are recombined with each other to form excitons of the Ir. Of course, a certain amount of holes and electrons are injected to the CBP layer to form excitons of the CBP by their recombination. However, light emission can not be observed from the CBP layer since the CBP hardly emit light. A certain amount of electrons can be transported from the CBP layer to the α-NPD layer since an energy barrier is comparatively small. Therefore, a certain amount of light is generated in the α-NPD layer.

When a large amount of current is applied, holes and electrons are gathered in a CBP layer, and excitons of the Ir are generated by recombination of the holes and the electrons. Since the excitation lifetime of Ir is so long that the excitons of the Ir are saturated. Then, all of the Ir are excited. When further amount of current is applied, holes and electrons are gathered in the CBP layer, the CBP becomes CBP cation radical or CBP anion radical. There is the possibility of their recombination; however, light can not be generated.

When more further amount of current is applied, holes are gathered in the α-NPD layer. Then, a part of the α-NPD layer near the CBP layer becomes entirely α-NPD cation radical having no a ground state. Further, the injection of electrons from the CBP layer to the α-NPD layer leads to increase the number of molecules at excited state than that at the ground state. Consequently, population inversion is formed, and laser oscillation is induced.

EXAMPLE 3

An example of a semiconductor display device, which is one of the semiconductor device according to the present invention, will be explained in Embodiment 3.

Figure 12:
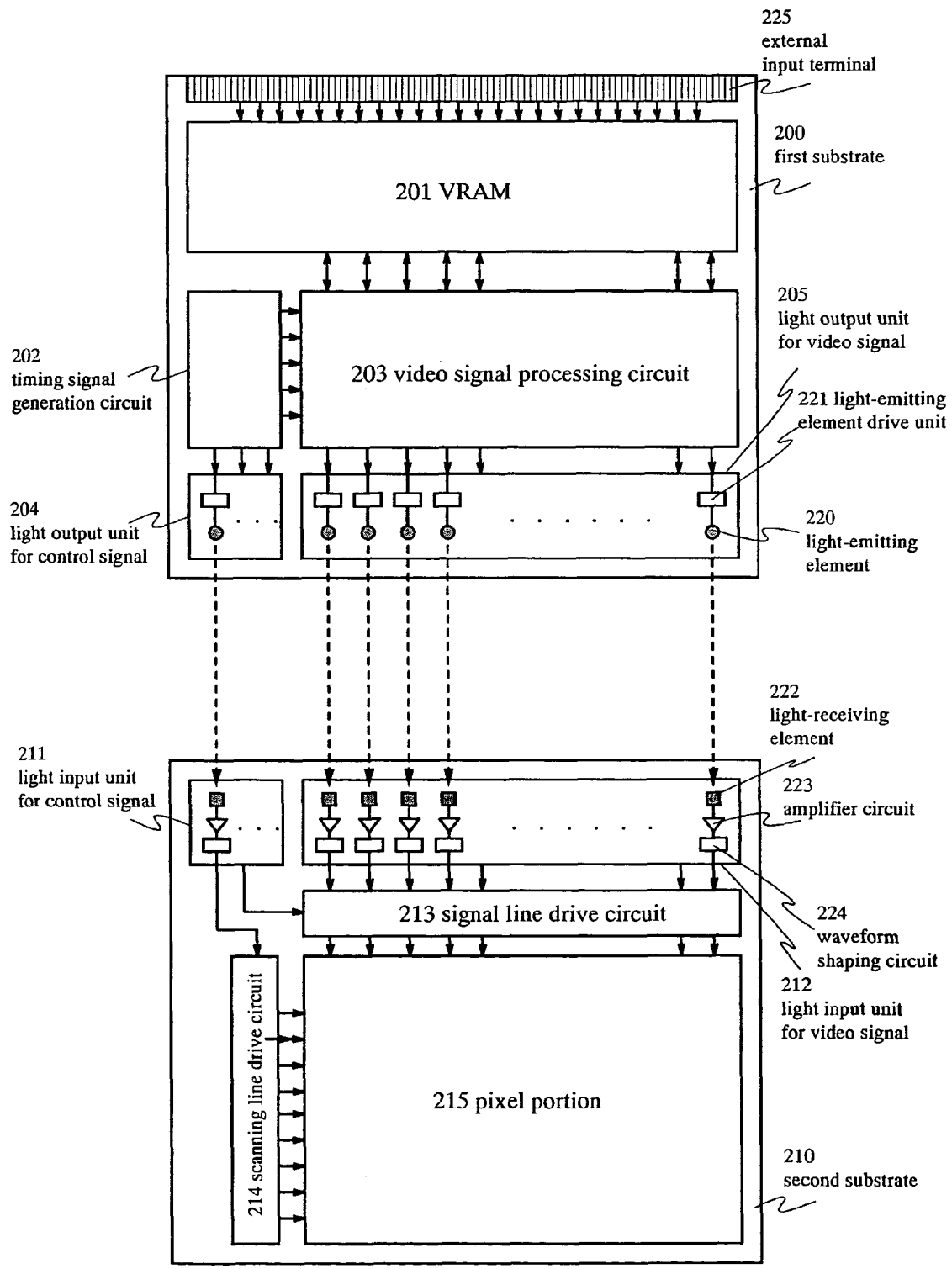
FIG. 12 is a block diagram for showing the structure of a semiconductor display device according to the invention.

FIG. 12 is a block diagram for showing the structure of a semiconductor display device according to Example 3. The semiconductor display device shown in FIG. 12 has two glass substrates. An external input terminal 225, a VRAM (Video Random Access Memory) 201, a timing signal generation circuit 202, a video signal processing circuit 203, a light output unit for control signal 204, and a light output unit for video signal 205 are provided to a first substrate 200.

One or a plurality of light-emitting elements 220 and light-emitting element drive units 221 corresponding respectively to the foregoing light-emitting element are provided to each of the light output unit for control signal 204 and the light output unit for video signal 205. Further, one light-emitting element drive unit 221 may correspond to either a plurality of the light-emitting elements 220 or the single light-emitting element 220.

A light input unit for control signal 211, a light input unit for video signal 212, a signal line drive circuit 213, a scanning line drive circuit 214 and a pixel portion 215 are provided over a second substrate 210.

One or a plurality of light-receiving elements 222, and amplifier circuits 223 and waveform shaping circuits 224, each of which is correspond to the light-receiving element 222, are provided to the light input unit for control signal 211 and the light input unit for video signal 212.

Data including image information input from the external input terminal 225 is stored in the VRAM 201. For adjusting to the standard of the signal line drive circuit 213 in the video signal processing circuit 203, a certain amount of processing is done on the data to transmit the processed data as a video signal to the light output unit for video signal 205. Light emission from the light-emitting element 220 is controlled by the sent video signal in the light-emitting element drive unit 221 of the light output unit for video signal 205.

Clock signals (CLK), start pulse signals (SP), latch signals, and the like, each of which controls the timing of the drive of the video signal processing circuit 203, the signal line drive circuit 213, and the scanning line drive circuit 214, are generated in the timing signal generation circuit 202. A signal for controlling the driver of the video signal processing circuit 203 is given thereto directly. On the contrary, a signal for being given to the circuit formed over the second substrate 210 such as the signal line drive circuit 213 and the scanning line drive circuit 214 is converted into a light signal in the light output unit for control signal 204, and converted again into an electrical signal in the light input unit for control signal 211. Various control signals converted into electrical signals are given to the signal line drive circuit 213 and the scanning line drive circuit 214.

The signal line drive circuit 213 drives in synchronization with the timing of the given control signal and samples a video signal to input them into the pixel portion 215. The scanning line drive circuit 214 is synchronized with the inputted control signal to control the timing for inputting a video signal to each pixel of the pixel portion 215.

Though data including image information is transmitted as an electrical signal via the external input terminal 225 in Example 3, the data may be transmitted as a light signal instead of the electrical signal.

Figure 6A:
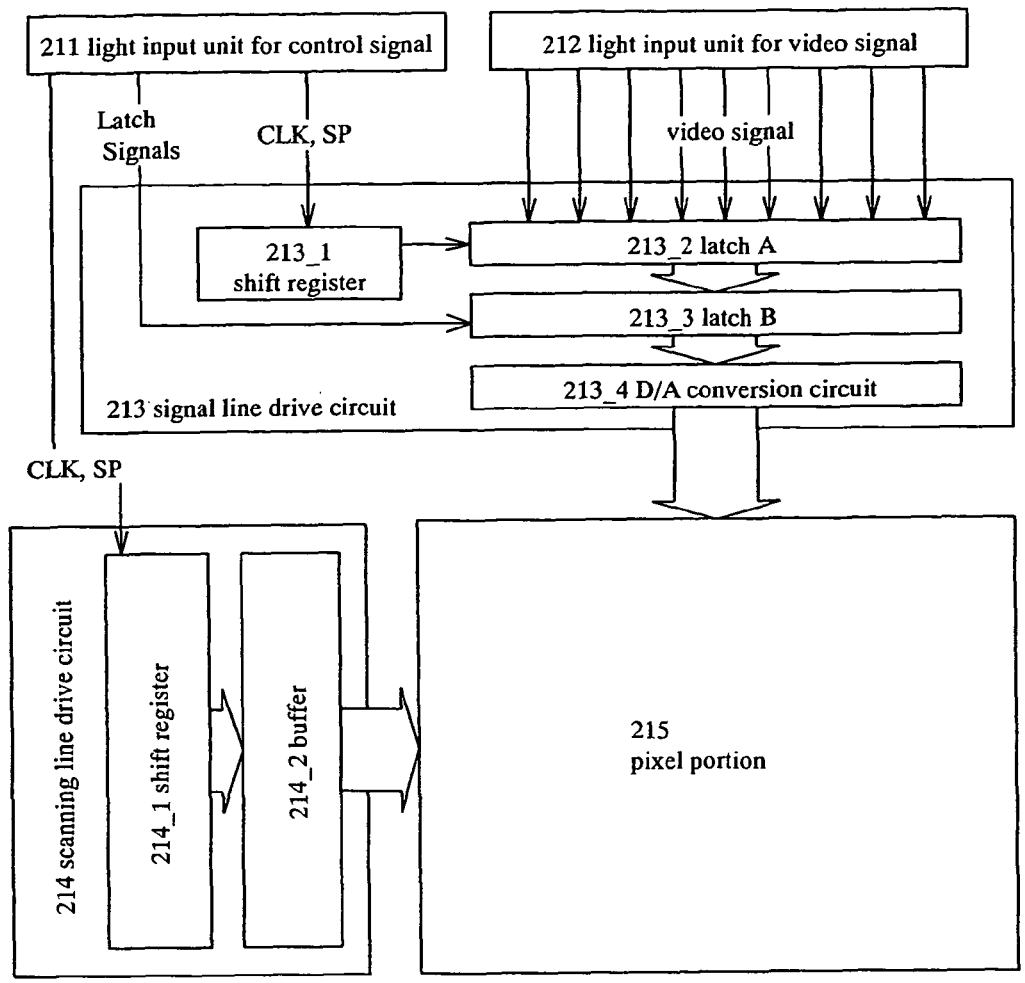
FIGS. 6A and 6B are views for showing a signal line drive circuit, a scanning line drive circuit, and a pixel portion.
Figure 6B:
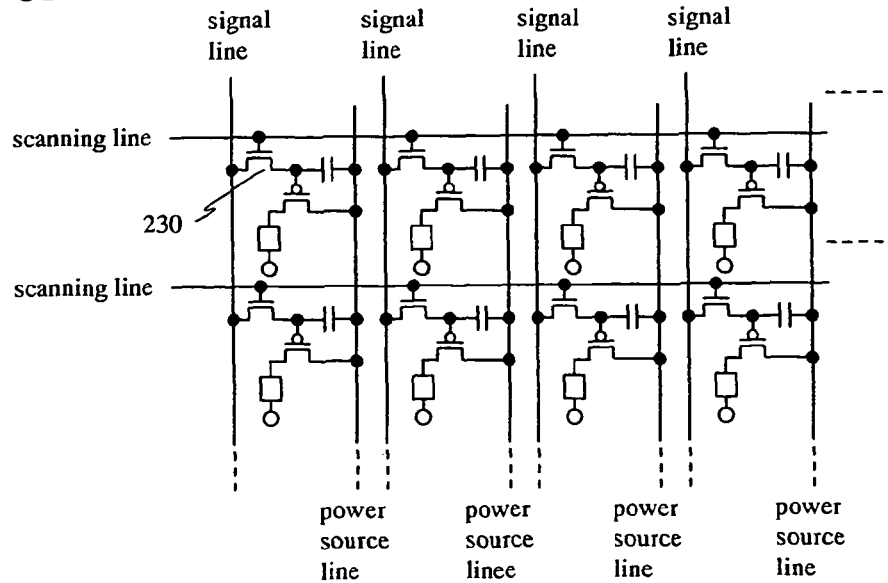

FIGS. 6A and 6B show a specific structure of an active matrix semiconductor display device composed of the signal line drive circuit 213, the scanning line drive circuit 214, and the pixel portion 215. FIGS. 6A and 6B are views for showing the case that an OLED (Organic Light Emitting Device) is used as a light-emitting element, which is one of elements for displaying image on the pixel portion 215.

In FIG. 6A, the signal line drive circuit 213 has a shift register 213_1, a latch A213_2, a latch B213_3, and D/A conversion circuit 213_4. The shift register 213_1 produces timing signals sequentially based on inputted clock signals (CLK) and start pulse signals (SP) to supply the timing signals sequentially to a circuit of the subsequent stages.

A timing signal from the shift register 213_1 may be buffered and amplified by a buffer or the like to supply the buffered and amplified timing signal sequentially to a circuit of the subsequent stages. The wiring that is supplied with the timing signals has large load capacity (parasitic capacity) since a number of circuits or devices are connected to the wiring. In order to prevent the "dullness" of rise and fall of timing signals due to the large load capacity, the buffer is provided.

Timing signals from the shift register 213_1 are supplied to the latch A213_2. The latch A213_2 has the latch of a plurality of stages for processing a digital video signal. The latch A213_2 writes sequentially the video signal upon inputting the timing signal to hold the inputted video signals.

Further, when a video signal is introduced into the latch A213_2, a video signal is inputted sequentially to the latch of a plurality of stages of the latch A213_2.

The period required for series of writing a video signal to latch of all stages of the latch A213_2 is referred to as a line period. The time interval of from the beginning of writing a video signal to the latch at the far left stage of the latch A213_2 to the end of the writing of a video signal to the latch at the far right stage of the latch A213_2 is referred to as a line period. Practically, the line period may include a horizontal retrace line period.

After one line period is completed, a latch signal is supplied to a latch B213_3. In that instant, all of the written and held video signals in the latch A213_2 are sent to the latch B213_3 simultaneously, and written to the latch of all stages of the latch B213_3 to be held.

After sending a video signal to the latch B213_3, the latch A 213_2 performs writing a video signal again based on timing signals from the shift register 213_1.

During the one line period of second turnaround, the video signal written and held in the latch B213_3 is converted into analog in a D/A converter circuit 213_4 to be inputted to a signal line provided to the pixel portion 215.

Further, it is not always necessary to use the D/A converter circuit 213_4; a digital video signal may be inputted to the signal line provided to the pixel portion 215 without using the D/A converter circuit 213_4 in case of performing time division gradation.

Since the bus width of light signals in the light input unit for video signal 212 can be made largely, the number of input signals in the light input unit for video signal 212 is allowed to be the same as that of signal lines of one line. In this instance, drive can be performed without the shift register 213_1 since writing to latches of all stages can be performed at once without selecting latches sequentially by timing signals to perform writing. Even if the number of input signals in the light input unit for video signal 212 do not correspond to all signal lines of one line, the drive frequency of the signal line drive circuit 213 can be reduced sufficiently compared to the case of using a terminal since the bus width of light signals in light input/output unit can be made largely at any rate.

Further, in case that the number of input signals in the light input unit for video signal 212 is the same as that of the signal lines of one line, the drive can be possible without the latch B 213_3.

On the contrary, the scanning line drive circuit 214 includes a shift register 214_1 and a buffer 214_2, respectively. In some cases, a level shifter may also be provided to the scanning line drive circuit 214.

In the scanning line drive circuit 214, select signals from the shift register 214_1 are supplied to a buffer to supply to corresponding scanning lines.

FIG. 6B shows a part of a pixel portion. Each gate of TFTs 230 for 1 line pixel is connected to each scanning line. Based on the fact that TFTs 230 for 1 line pixel should be turned ON simultaneously, the buffer 214_2 capable of applying large amounts of current is used.

Figure 14A:
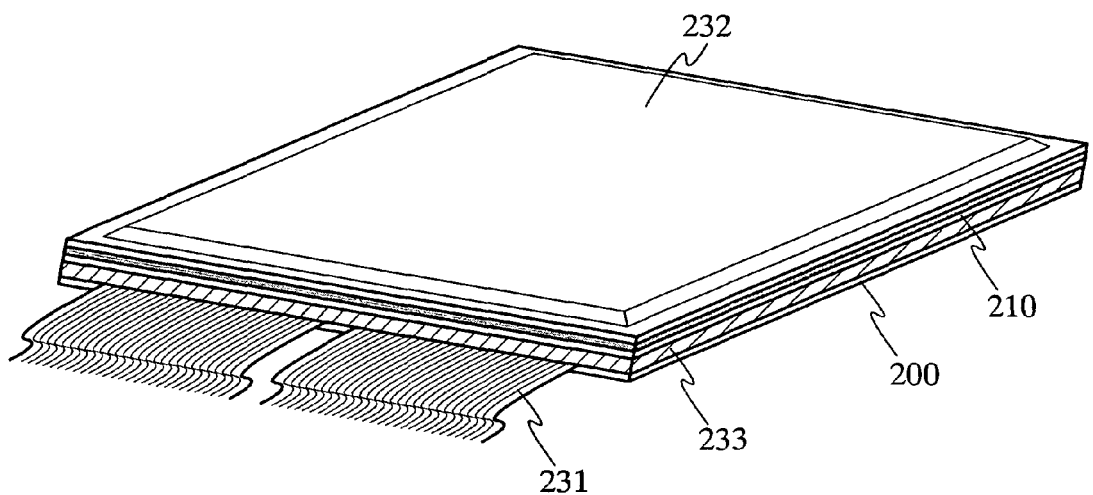
FIGS. 14A and 14B are a perspective view and a cross-sectional view for showing a semiconductor display device according to the invention.
Figure 14B:
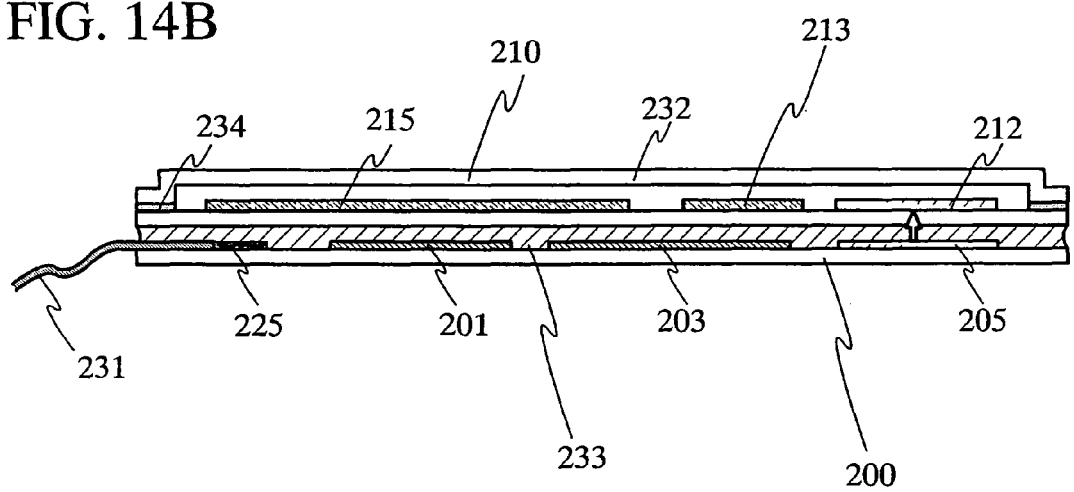

Then, an external view of a semiconductor display device according to Example 3 is explained. FIG. 14A shows one embodiment of a perspective view showing a semiconductor display device shown in FIG. 12. FIG. 14B shows a cross-sectional view of the semiconductor display device.

The external input terminal 225 formed over the first substrate 200 is connected to an FPC 231. Data including image information is inputted to the external input terminal 225 via the FPC 231. As shown in FIG. 14B, the VRAM 201, the video signal processing circuit 203, and the light output unit for video signal 205 are provided over the first substrate 200. Other than the components shown in FIG. 14B, the timing signal generation circuit 202 and the light output unit for control signal 204 are provided over the first substrate 200.

The first substrate 200 is pasted with the second substrate 210 using adhesive material 233 so as to correspond to it. Any material can be used for the adhesive material 233 as long as the material that is transparent to light and has most appropriate refraction index in consideration of cross talk.

The pixel portion 215, the signal line drive circuit 213, and the light input unit for video signal 212 are provided over the second substrate 210. Further, other than the components shown in FIG. 14B, the scanning line drive circuit 214 and the light input unit for control signal 211 are provided over the second substrate 210.

The pixel portion 215 formed over the second substrate 210, an inert gas, resin, and the like are hermetically sealed between the second substrate 210 and a cover member 232. In addition, the second substrate 210 and the cover member 232 are sealed with a sealing member 234.

The light output unit for video signal 205 formed over the first substrate 200 is overlapped with the light input unit for video signal 212 via the adhesive material 233 and the second substrate 210. The light output unit for control signal 204 is also overlapped with the light input unit for control signal 211 via the adhesive material 233 and the second substrate 210.

In Example 3, a semiconductor display device uses, but not exclusively, a light-emitting element as a display device. A device other than the light-emitting element can be used as a display device for the semiconductor display device. The semiconductor display device may be a liquid crystal display device (LCD), a PDP, a DLP, or another semiconductor display device.

EXAMPLE 4

A semiconductor device according to the present invention can be applied to various pieces of electronic equipment. Given as examples of the electronic equipment are personal digital assistants (electronic books, mobile computers, cellular phones, or the like); video cameras; digital cameras; personal computers; TV sets; projection display devices; and the like. FIGS. 15A to 15H show specific examples of the electronic equipment.

Figure 15A:
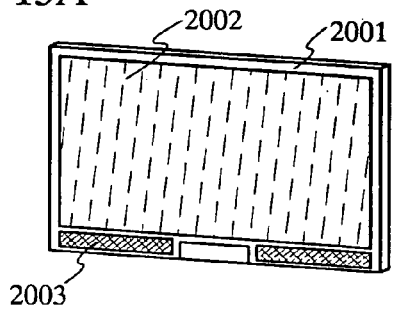
FIGS. 15A to 15H are views for showing an embodiment of a light-emitting element of a semiconductor device according to the invention.

FIG. 15A shows a display device composed of a casing 2001; a display portion 2002; a speaker unit 2003; and the like. According to the present invention, the display device can be completed by manufacturing the display portion 2002 or another circuit for signal processing. The display device includes display devices for all information such as for a personal computer; TV broadcast reception; advertisement; and the like.

Figure 15B:
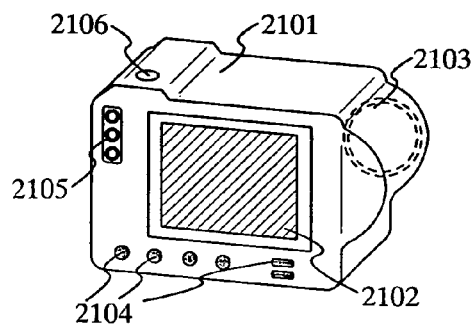

FIG. 15B shows a digital still camera composed of a main body 2101; a display portion 2102; an image reception portion 2103; operation keys 2104; an external connection port 2105; a shutter 2106; and the like. The digital still camera according to the invention is completed by using the semiconductor device according to the invention as the display portion 2102 or another circuit.

Figure 15C:
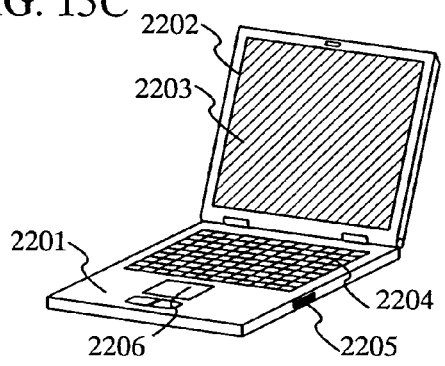

FIG. 15C shows a laptop computer composed of a main body 2201; a casing 2202; a display portion 2203; a keyboard 2204; an external connection port 2205; a pointing mouse 2206; and the like. The laptop computer according to the invention is completed by using the semiconductor device according to the invention as the display portion 2203 or another circuit.

Figure 15D:
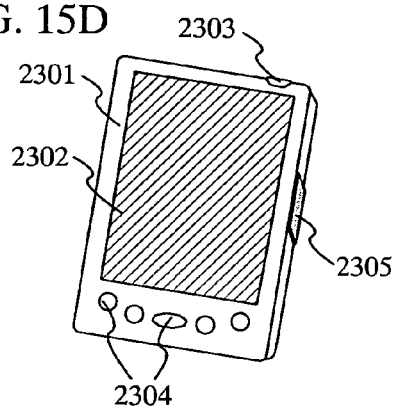

FIG. 15D shows a mobile computer composed of a main body 2301; a display portion 2302 a switch 2303; operation keys 2304; an infrared port 2305; and the like. The mobile computer according to the invention is completed by using the semiconductor device according to the invention as the display portion 2302 or another circuit.

Figure 15E:
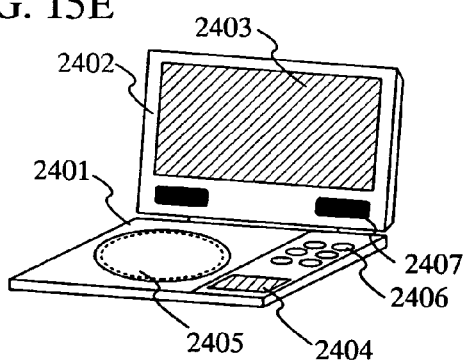

FIG. 15E shows a portable image reproduction device including a recording medium (specifically, a DVD reproduction device) composed of a main body 2401; a casing 2402; a display portion A 2403; another display portion B 2404; a recording medium (DVD or the like) reading portion 2405; operation keys 2406; a speaker portion 2407; and the like. The display portion A 2403 is used mainly for displaying image information, while the display portion B 2404 is used mainly for displaying character information. Note that image reproduction device including a recording medium includes game machines for domestic use and the like. The image reproduction device according to the invention is completed by using the semiconductor device according to the invention as the display potion A 2403 and the display portion B 2404, or another circuit.

Figure 15F:
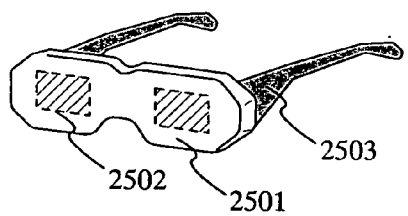

FIG. 15F shows a goggle type display (head mounted display) composed of a main body 2501; a display portion 2502; and an arm portion 2503. The goggle type display according to the invention is completed by using the semiconductor device according to the invention as the display portion 2502 or another circuit.

Figure 15G:
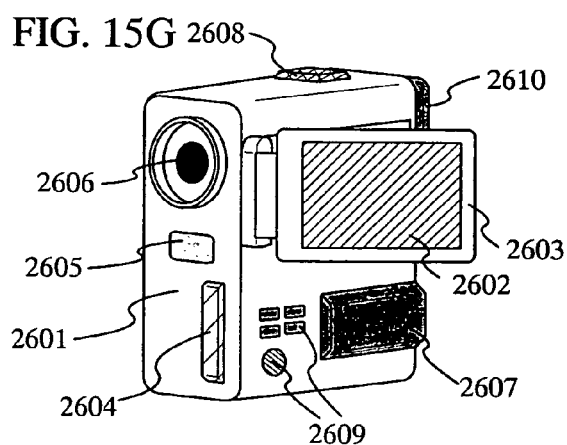

FIG. 15G shows a video camera composed of a main body 2601; a display portion 2602; an casing 2603; an external connecting port 2604; a remote control receiving portion 2605; an image reception portion 2606; a battery 2607; a sound input portion 2608; operation keys 2609; an eyepiece potion 2610; and the like. The video camera according to the invention is completed by using the semiconductor device according to the invention as the display portion 2602 or another circuit.

Figure 15H:
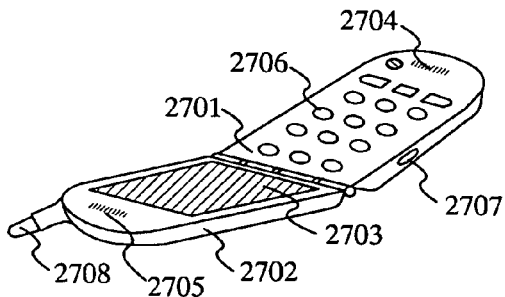

FIG. 15H shows a cellular phone composed of a main body 2701; a casing 2702; a display portion 2703; a sound input portion 2704; a sound output portion 2705; operation keys 2706; an external connecting port 2707; an antenna 2708; and the like. The display portion 2703 can reduce power consumption of the cellular phone by displaying white-colored characters on a black-colored background. The cellular phone according to the invention is completed by using the semiconductor device according to the invention as the display portion 2703 or another circuit.

As set forth above, the applicable range of the invention is extremely large, so that the light-emitting apparatus can be applied to various fields' electronic equipments. Example 4 can be practiced by combining with any one of structures described in Examples 1 to 3.

Although the present invention has been fully described by way of examples with reference to the accompanying drawings, it is to be understood that various changes and modifications will be apparent to those skilled in the art. Therefore, unless otherwise such changes and modifications depart from the scope of the present invention hereinafter described, they should be construed as being included therein.

What is claimed is:

1. A semiconductor device comprising:
a first substrate provided with a first circuit including a first semiconductor element and a light-emitting element; and
a second substrate provided with a second circuit including a second semiconductor element and a light-receiving element,
wherein the light-emitting element which comprises an electroluminescent layer interposed between a pair of electrodes is formed over an insulating film, in which laser light is oscillated upon applying current to the electroluminescent layer;
wherein the electroluminescent layer is adjacent to a conductive film which is formed over the insulating film;
wherein the laser light oscillated from the electroluminescent layer is reflected by the conductive film; and
wherein a signal is transmitted between the first circuit and the second circuit by generating a light signal using the laser light oscillated in the light-emitting element and converting the light signal into an electrical signal in the light-receiving element.

2. The semiconductor device according to claim 1,
wherein a plurality of layers capable of emitting light are stacked on each other in the electroluminescent layer.

3. The semiconductor device according to claim 1,
wherein the pair of electrodes comprises a metal and reflects light; and
wherein the light signal is formed by using light emitted from an opening portion provided to either of the pair of electrodes.

4. The semiconductor device according to claim 1,
wherein the electroluminescent layer includes a light-emitting layer which contains a metal complex as dopant.

5. The semiconductor device according to claim 1,
wherein intervals between the diffraction gratings are half of a wavelength of light generated in the electroluminescent layer or integral multiple of the half of the wavelength.

6. The semiconductor device according to claim 1, further comprising:
a film covering an edge surface of the electroluminescent layer,
wherein the laser light is oscillated from the edge surface of the electroluminescent layer.

7. The semiconductor device according to claim 1,
wherein the laser light is oscillated from a direction which crosses a direction of applying current.

8. The semiconductor device according to claim 1,
wherein the semiconductor device is used for a display portion of an electronic equipment selected from the group consisting of a digital camera, a laptop computer, a mobile computer, an image reproduction device, a goggle type display, a video camera, and a cellular phone.

9. The semiconductor device according to claim 1,
wherein at least one of the first substrate and the second substrate is a glass substrate.

10. The semiconductor device according to claim 1,
wherein one of the pair of electrodes, the light-element, the other one of the pair of electrodes are stacked in this order.

11. The semiconductor device according to claim 1,
wherein the diffraction grating comprises a plurality of gratings,
wherein the plurality of gratings are equally spaced and arranged.

12. A semiconductor device comprising:
a first substrate provided with a first circuit including a first semiconductor element and a light-emitting element; and
a second substrate provided with a second circuit including a second semiconductor element and a light-receiving element,
wherein the light-emitting element which comprises an electroluminescent layer interposed between a pair of electrodes is formed over an insulating film, in which laser light is oscillated in the light-emitting element upon applying current to the electroluminescent layer;
wherein the electroluminescent layer is adjacent to a conductive film which is formed over the insulating film;
wherein the laser light oscillated from the electroluminescent layer is reflected by the conductive film;
wherein a first electrical signal output from the first circuit is converted into a light signal using the laser light by the light-emitting element over the first substrate; and
wherein the light signal is converted into a second electrical signal over the second substrate, and a waveform shaping of the second electrical signal is performed to input the second electrical signal to the second circuit.

13. The semiconductor device according to claim 12,
wherein a plurality of layers capable of emitting light are stacked on each other in the electroluminescent layer.

14. The semiconductor device according to claim 12,
wherein the pair of electrodes comprises a metal and reflects light; and
wherein the light signal is formed by using light emitted from an opening portion provided to either of the pair of electrodes.

15. The semiconductor device according to claim 12,
wherein the electroluminescent layer includes a light-emitting layer which contains a metal complex as dopant.

16. The semiconductor device according to claim 12,
wherein intervals between the diffraction gratings are half of a wavelength of light generated in the electroluminescent layer or integral multiple of the half of the wavelength.

17. The semiconductor device according to claim 12, further comprising:
a film covering an edge surface of the electroluminescent layer,
wherein the laser light is oscillated from the edge surface of the electroluminescent layer.

18. The semiconductor device according to claim 12,
wherein the laser light is oscillated from a direction which crosses a direction of applying current.

19. The semiconductor device according to claim 12,
wherein the semiconductor device is used for a display portion of an electronic equipment selected from the group consisting of a digital camera, a laptop computer, a mobile computer, an image reproduction device, a goggle type display, a video camera, and a cellular phone.

20. The semiconductor device according to claim 12,
wherein at least one of the first substrate and the second substrate is a glass substrate.

21. The semiconductor device according to claim 12,
wherein one of the pair of electrodes, the light-element, the other one of the pair of electrodes are stacked in this order.

22. The semiconductor device according to claim 12,
wherein the diffraction grating comprises a plurality of gratings,
wherein the plurality of gratings are equally spaced and arranged.

23. A semiconductor device comprising:
a first substrate comprising a first semiconductor element and a light-emitting element; and
a second substrate comprising a second semiconductor element, a light-receiving element and an amplifier circuit,
wherein the light-emitting element which comprises an electroluminescent layer interposed between a pair of electrodes is formed over an insulating film, in which laser light is oscillated in the light-emitting element upon applying current to the electroluminescent layer;
wherein the electroluminescent layer is adjacent to a conductive film formed over the insulating film;
wherein the laser light oscillated from the electroluminescent layer is reflected by the conductive film;
wherein a light signal using the laser light is converted into an electrical signal over the second substrate; and
wherein the electrical signal is amplified by the amplifier circuit.

24. The semiconductor device according to claim 23, wherein the electroluminescent layer comprises a plurality of layers capable of emitting light.

25. The semiconductor device according to claim 23, wherein the pair of electrodes comprises a metal and reflects light; and
wherein the light signal is formed by using light emitted from an opening portion provided to either of the pair of electrodes.

26. The semiconductor device according to claim 23, wherein the electroluminescent layer comprises a light-emitting layer including a metal complex as dopant.

27. The semiconductor device according to claim 23, wherein intervals between the diffraction gratings are half of a wavelength of light generated in the electroluminescent layer or integral multiple of the half of the wavelength.

28. The semiconductor device according to claim 23, further comprising:
a film covering an edge surface of the electroluminescent layer,
wherein the laser light is oscillated from the edge surface of the electroluminescent layer.

29. The semiconductor device according to claim 23, wherein the laser light is oscillated from a direction which crosses a direction of applying current.

30. The semiconductor device according to claim 23, wherein the semiconductor device is used for a display portion of an electronic equipment selected from the group consisting of a digital camera, a laptop computer, a mobile computer, an image reproduction device, a goggle type display, a video camera, and a cellular phone.

31. The semiconductor device according to claim 23, wherein at least one of the first substrate and the second substrate is a glass substrate.

32. The semiconductor device according to claim 23, wherein one of the pair of electrodes, the light-element, the other one of the pair of electrodes are stacked in this order.

33. The semiconductor device according to claim 23, wherein the diffraction grating comprises a plurality of gratings,
wherein the plurality of gratings are equally spaced and arranged.

34. A semiconductor device comprising:
a first substrate comprising a first semiconductor element and a light-emitting element; and
a second substrate comprising a second semiconductor element and a light-receiving element,
wherein the light-emitting element which comprises an electroluminescent layer interposed between a pair of electrodes is formed over an insulating film, in which laser light is oscillated in the light-emitting element upon applying current to the electroluminescent layer;
wherein the electroluminescent layer is adjacent to a conductive film formed over the insulating film;
wherein the laser light oscillated from the electroluminescent layer is reflected by the conductive film; and
wherein an electrical signal is converted into a light signal using the laser light over the first substrate.

35. The semiconductor device according to claim 34, wherein the electroluminescent layer comprises a plurality of layers capable of emitting light.

36. The semiconductor device according to claim 34, wherein the pair of electrodes comprises a metal and reflects light; and
wherein the light signal is formed by using light emitted from an opening portion provided to either of the pair of electrodes.

37. The semiconductor device according to claim 34, wherein the electroluminescent layer comprises a light-emitting layer including a metal complex as dopant.

38. The semiconductor device according to claim 34, wherein intervals between the diffraction gratings are half of a wavelength of light generated in the electroluminescent layer or integral multiple of the half of the wavelength.

39. The semiconductor device according to claim 34, further comprising:
a film covering an edge surface of the electroluminescent layer,
wherein the laser light is oscillated from the edge surface of the electroluminescent layer.

40. The semiconductor device according to claim 34, wherein the laser light is oscillated from a direction which crosses a direction of applying current.

41. The semiconductor device according to claim 34, wherein the semiconductor device is used for a display portion of an electronic equipment selected from the group consisting of a digital camera, a laptop computer, a mobile computer, an image reproduction device, a goggle type display, a video camera, and a cellular phone.

42. The semiconductor device according to claim 34, wherein at least one of the first substrate and the second substrate is a glass substrate.

43. The semiconductor device according to claim 34, wherein one of the pair of electrodes, the light-element, the other one of the pair of electrodes are stacked in this order.

44. The semiconductor device according to claim 34, wherein the diffraction grating comprises a plurality of gratings,
wherein the plurality of gratings are equally spaced and arranged.

45. A semiconductor device comprising:
a first substrate comprising a first semiconductor element and a light-emitting element; and
a second substrate comprising a second semiconductor element and a light-receiving element,
wherein the light-emitting element which comprises an electroluminescent layer interposed between a pair of electrodes is formed over an insulating film, in which laser light is oscillated in the light-emitting element upon applying current to the electroluminescent layer;
wherein the electroluminescent layer is adjacent to a conductive film formed over the insulating film;
wherein the laser light oscillated from the electroluminescent layer is reflected by the conductive film;
wherein a first electrical signal is converted into a light signal using the laser light over the first substrate; and
wherein the light signal is converted into a second electrical signal over the second substrate.

46. The semiconductor device according to claim 45, wherein the electroluminescent layer comprises a plurality of layers capable of emitting light.

47. The semiconductor device according to claim 45, wherein the pair of electrodes comprises a metal and reflects light; and
wherein the light signal is formed by using light emitted from an opening portion provided to either of the pair of electrodes.

48. The semiconductor device according to claim 45,
wherein the electroluminescent layer comprises a light-emitting layer including a metal complex as dopant.

49. The semiconductor device according to claim 45,
wherein intervals between the diffraction gratings are half of a wavelength of light generated in the electroluminescent layer or integral multiple of the half of the wavelength.

50. The semiconductor device according to claim 45, further comprising:
a film covering an edge surface of the electroluminescent layer,
wherein the laser light is oscillated from the edge surface of the electroluminescent layer.

51. The semiconductor device according to claim 45,
wherein the laser light is oscillated from a direction which crosses a direction of applying current.

52. The semiconductor device according to claim 45,
wherein the semiconductor device is used for a display portion of an electronic equipment selected from the group consisting of a digital camera, a laptop computer, a mobile computer, an image reproduction device, a goggle type display, a video camera, and a cellular phone.

53. The semiconductor device according to claim 45,
wherein at least one of the first substrate and the second substrate is a glass substrate.

54. The semiconductor device according to claim 45,
wherein one of the pair of electrodes, the light-element, the other one of the pair of electrodes are stacked in this order.

55. The semiconductor device according to claim 45,
wherein the diffraction grating comprises a plurality of gratings,
wherein the plurality of gratings are equally spaced and arranged.

56. A semiconductor device comprising:
a first substrate comprising a first semiconductor element, a light-emitting element and a driving unit; and
a second substrate comprising a second semiconductor element and a light-receiving element,
wherein the light-emitting element which comprises an electroluminescent layer interposed between a pair of electrodes is formed over an insulating film, in which laser light is oscillated in the light-emitting element upon applying current to the electroluminescent layer;
wherein the electroluminescent layer is adjacent to a conductive film formed over the insulating film;
wherein the laser light oscillated from the electroluminescent layer is reflected by the conductive film; and
wherein light emission of the light-emitting element is controlled using an electrical signal by the driving unit, thereby forming a light signal.

57. The semiconductor device according to claim 56,
wherein the electroluminescent layer comprises a plurality of layers capable of emitting light.

58. The semiconductor device according to claim 56,
wherein the pair of electrodes comprises a metal and reflects light; and
wherein the light signal is formed by using light emitted from an opening portion provided to either of the pair of electrodes.

59. The semiconductor device according to claim 56,
wherein the electroluminescent layer comprises a light-emitting layer including a metal complex as dopant.

60. The semiconductor device according to claim 56,
wherein intervals between the diffraction gratings are half of a wavelength of light generated in the electroluminescent layer or integral multiple of the half of the wavelength.

61. The semiconductor device according to claim 56, further comprising:
a film covering an edge surface of the electroluminescent layer,
wherein the laser light is oscillated from the edge surface of the electroluminescent layer.

62. The semiconductor device according to claim 56,
wherein the laser light is oscillated from a direction which crosses a direction of applying current.

63. The semiconductor device according to claim 56,
wherein the semiconductor device is used for a display portion of an electronic equipment selected from the group consisting of a digital camera, a laptop computer, a mobile computer, an image reproduction device, a goggle type display, a video camera, and a cellular phone.

64. The semiconductor device according to claim 56,
wherein at least one of the first substrate and the second substrate is a glass substrate.

65. The semiconductor device according to claim 56,
wherein one of the pair of electrodes, the light-element, the other one of the pair of electrodes are stacked in this order.

66. The semiconductor device according to claim 56,
wherein the diffraction grating comprises a plurality of gratings,
wherein the plurality of gratings are equally spaced and arranged.

67. A semiconductor device comprising:
a first substrate comprising a first semiconductor element and a light-emitting element; and
a second substrate comprising a second semiconductor element and a light-receiving element,
wherein the light-emitting element which comprises an electroluminescent layer interposed between a pair of electrodes is formed over an insulating film, in which laser light is oscillated in the light-emitting element upon applying current to the electroluminescent layer;
wherein the electroluminescent layer is adjacent to a conductive film formed over the insulating film;
wherein the laser light oscillated from the electroluminescent layer is reflected by the conductive film; and
wherein a light signal using the laser light is received by the light-receiving element.

68. The semiconductor device according to claim 67,
wherein the electroluminescent layer comprises a plurality of layers capable of emitting light.

69. The semiconductor device according to claim 67,
wherein the pair of electrodes comprises a metal and reflects light; and
wherein the light signal is formed by using light emitted from an opening portion provided to either of the pair of electrodes.

70. The semiconductor device according to claim 67,
wherein the electroluminescent layer comprises a light-emitting layer including a metal complex as dopant.

71. The semiconductor device according to claim 67,
wherein intervals between the diffraction gratings are half of a wavelength of light generated in the electroluminescent layer or integral multiple of the half of the wavelength.

72. The semiconductor device according to claim 67, further comprising:
- a film covering an edge surface of the electroluminescent layer,
- wherein the laser light is oscillated from the edge surface of the electroluminescent layer.

73. The semiconductor device according to claim 67,
- wherein the laser light is oscillated from a direction which crosses a direction of applying current.

74. The semiconductor device according to claim 67,
- wherein the semiconductor device is used for a display portion of an electronic equipment selected from the group consisting of a digital camera, a laptop computer, a mobile computer, an image reproduction device, a goggle type display, a video camera, and a cellular phone.

75. The semiconductor device according to claim 67,
- wherein at least one of the first substrate and the second substrate is a glass substrate.

76. The semiconductor device according to claim 67,
- wherein one of the pair of electrodes, the light-element, the other one of the pair of electrodes are stacked in this order.

77. The semiconductor device according to claim 67,
- wherein the diffraction grating comprises a plurality of gratings,
- wherein the plurality of gratings are equally spaced and arranged.

* * * * *